United States Patent
Corzine et al.

(10) Patent No.: US 11,621,774 B2
(45) Date of Patent: Apr. 4, 2023

(54) CONTROL AND PROGNOSIS OF POWER ELECTRONIC DEVICES USING LIGHT

(71) Applicants: The Regents of the University of California, Oakland, CA (US); The Government of the United States of America, as Represented by the Secretary of the Navy, Monterey, CA (US)

(72) Inventors: Keith Corzine, Santa Cruz, CA (US); Todd Weatherford, Santa Cruz, CA (US); Matthew Porter, Santa Cruz, CA (US)

(73) Assignees: The Regents of the University of California, Oakland, CA (US); The Government of the United States of America, as Represented by the Secretary of the Navy, Monterey, CA (US)

( * ) Notice: Subject to any disclaimer, the term of this patent is extended or adjusted under 35 U.S.C. 154(b) by 428 days.

(21) Appl. No.: 16/796,393

(22) Filed: Feb. 20, 2020

(65) Prior Publication Data

US 2020/0266886 A1    Aug. 20, 2020

Related U.S. Application Data

(60) Provisional application No. 62/808,242, filed on Feb. 20, 2019.

(51) Int. Cl.
*G01J 3/28* (2006.01)
*H04B 10/80* (2013.01)
(Continued)

(52) U.S. Cl.
CPC ............. *H04B 10/071* (2013.01); *G01J 3/28* (2013.01); *G02B 6/12007* (2013.01); *H01L 33/32* (2013.01); *H04B 10/801* (2013.01)

(58) Field of Classification Search
None
See application file for complete search history.

(56) References Cited

U.S. PATENT DOCUMENTS 3,946,335 A * 3/1976 De Loach, Jr. ...... H04B 10/564
372/29.01
4,969,152 A * 11/1990 Burghardt .......... H04B 10/2914
257/E31.096

(Continued)

OTHER PUBLICATIONS

Blood et al., "Measurement and calculation of spontaneous recombination current and optical gain in GaAs?AlGaAs quantum?well structures", J. Appl. Phys, vol. 70, pp. 1144, (1990).

(Continued)

*Primary Examiner* — Darren E Wolf
(74) *Attorney, Agent, or Firm* — Venable LLP; Henry J. Daley

(57) ABSTRACT

An optically-monitored and/or optically-controlled electronic device is described. The device includes at least one of a semiconductor transistor or a semiconductor diode. An optical detector is configured to detect light emitted by the at least one of the semiconductor transistor or the semiconductor diode during operation. A signal processor is configured to communicate with the optical detector to receive information regarding the light detected. The signal processor is further configured to provide information concerning at least one of an electrical current flowing in, a temperature of, or a condition of the at least one of the semiconductor transistor or the semiconductor diode during operation.

8 Claims, 14 Drawing Sheets

(51) Int. Cl.
*G02B 6/12* (2006.01)
*H04B 10/071* (2013.01)
*H01L 33/32* (2010.01)

(56) References Cited

U.S. PATENT DOCUMENTS

| | | | | |
|---|---|---|---|---|
| 2001/0029086 | A1* | 10/2001 | Ogawa | H01L 21/02546 438/453 |
| 2002/0181062 | A1* | 12/2002 | Graves | H04B 10/506 398/45 |
| 2005/0008280 | A1* | 1/2005 | Howley | H01S 5/0264 385/14 |
| 2008/0267621 | A1* | 10/2008 | Sheth | H04B 10/40 398/25 |
| 2015/0318952 | A1* | 11/2015 | Butrie | H04B 10/503 398/139 |

OTHER PUBLICATIONS

Bockowski et al., "Challenges and future perspectives in HVPE-GaN growth on ammonothermal GaN seeds", Semi. Sci. Tech., vol. 31, No. 9, (2016).

Ceccarelli et al., "Investigating SiC MOSFET Body Diode's Light Emission as Temperature-Sensitive Electrical Parameter," Microelectronics Reliability, pp. 627-630, (2018).

Hartmann et al., "Analysis of Insulation Failure Modes in High Power IGBT Modules," IEEE Industrial Application Society Annual Meeting, vol. 2, pp. 799-805, Hong Kong, China, (Oct. 2005).

Kioupakis et al., "Temperature and carrier-density dependence of Auger and radiative recombination in nitride optoelectronic devices", New Journal of Physics, vol. 15, pp. 125006, (2013).

Kizilyalli et al., "Vertical Power p-n Diodes Based on Bulk GaN", IEEE Trans. Elec. Dev., vol. 62, No. 2, pp. 414-422, (2015).

Krupa et al., "A Precise Pulsed Current Source For Absolute Calibration of Current Measurement Systems with No DC Response", Proc. IBIC2016, pp. 165, (2016).

Kucharski et al., "Ammonothermal growth of GaN crystals on HVPE-GaN seeds prepared with the use of ammonothermal substrates", Journal of Crystal Growth, vol. 427, pp. 1-6, (2015).

Matsudai et al., "Direct Photo Emission Monitoring for Analysis of IGBT Destruction Mechanism Using Streak Camera," IEEE International Symposium on Power Semiconductor Devices, pp. 135-138, Sapporo, Japan, (May/Jun. 2017).

Ogawa et al., "Optical Probe Current Sensor Module Using the Kerr Effect and its Application to IGBT Switching Current Measurements," IEEE International Conference on Sensing Technology, pp. 594-598, Palmerston North, New Zealand, (Nov./Dec. 2011).

Oki et al., "Influence of LO and LA phonon processes on thermal-nonequilibrium excitation and deexcitation dynamics of excitons in GaN, AlN and ZnO", J. Appl. Phys., vol. 125, pp. 205705, (2019).

Paskov et al., "Recombination of Free and Bound Excitons in GaN", Physics Status Solidi B, vol. 245, pp. 1723-1740, (2008).

Piprek "Efficiency droop in nitride-based light-emitting diodes", Phys. Stat. Sol. A, vol. 207, No. 10, pp. 2217-2225, (2010).

Silversmith et al., "Growth of Bulk GaN and AlN: Progress and Challenges," Proceedings of the IEEE, vol. 98, No. 7, pp. 1302-1315, (2010).

Tosi et al., "Modeling and Probing Hot-Carrier Luminescence from MOSFETs," IEEE Electron Device Letters, vol. 29, No. 4, pp. 350-352, (Apr. 2008).

\* cited by examiner

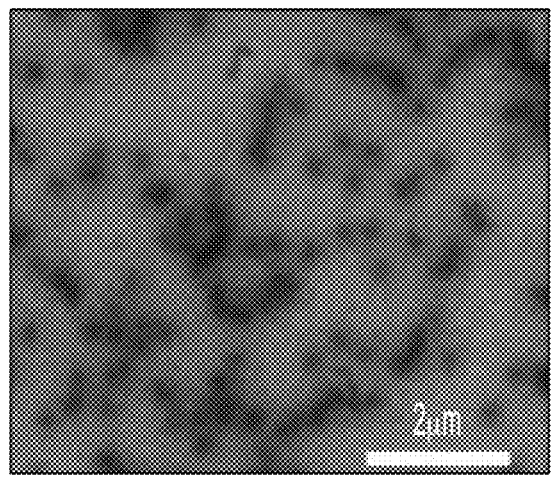
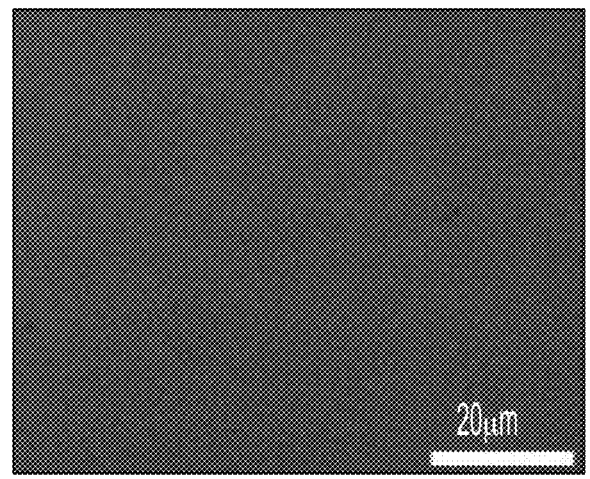
FIG. 2A  FIG. 2B
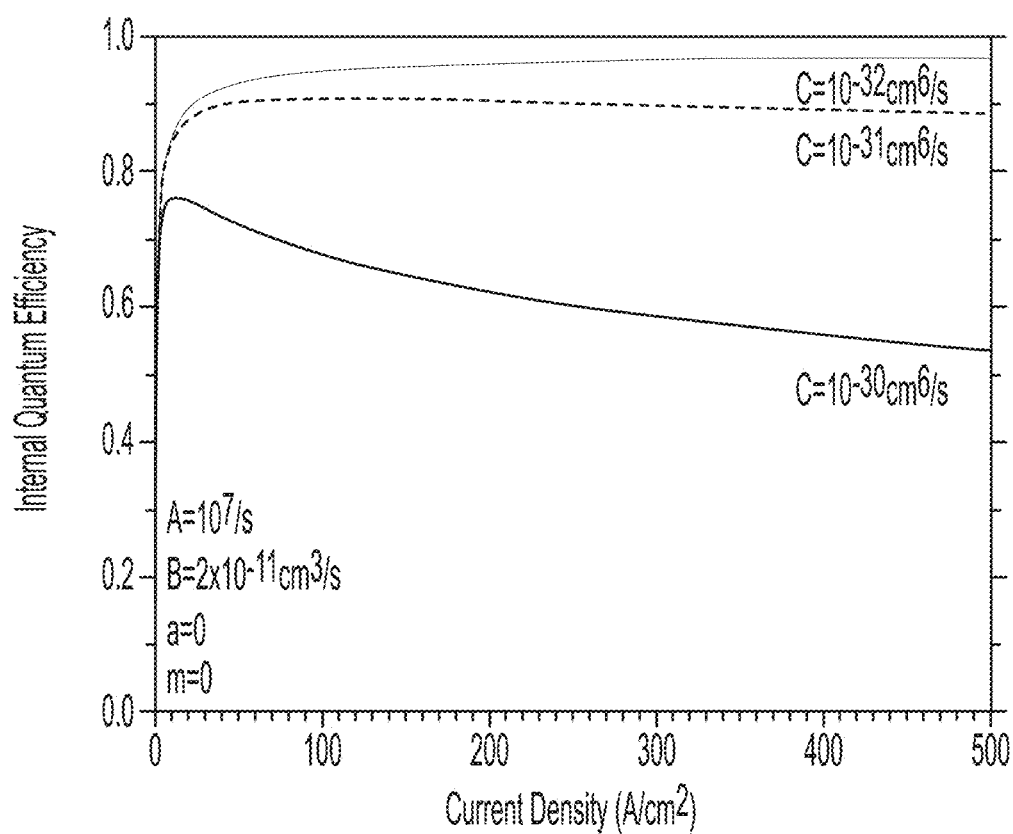
FIG. 3

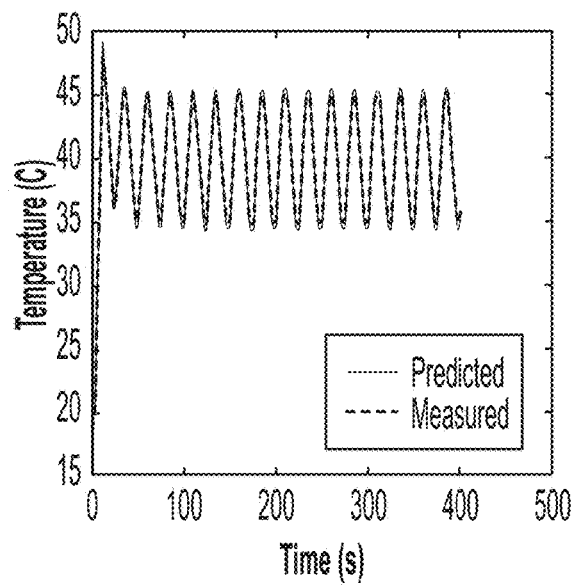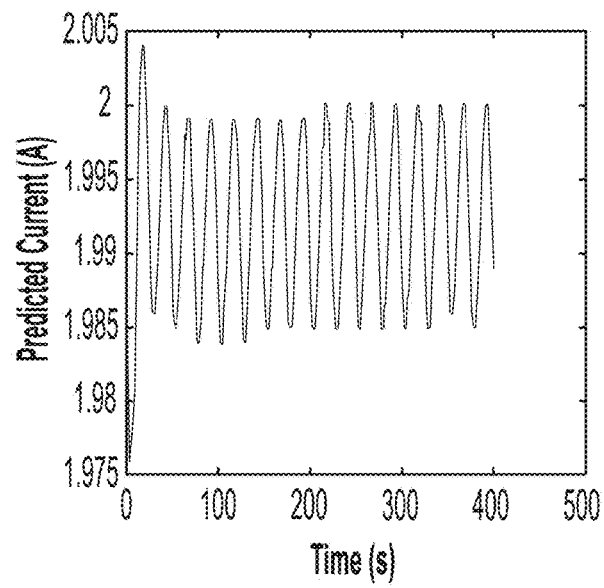
FIG. 20A  FIG. 20B
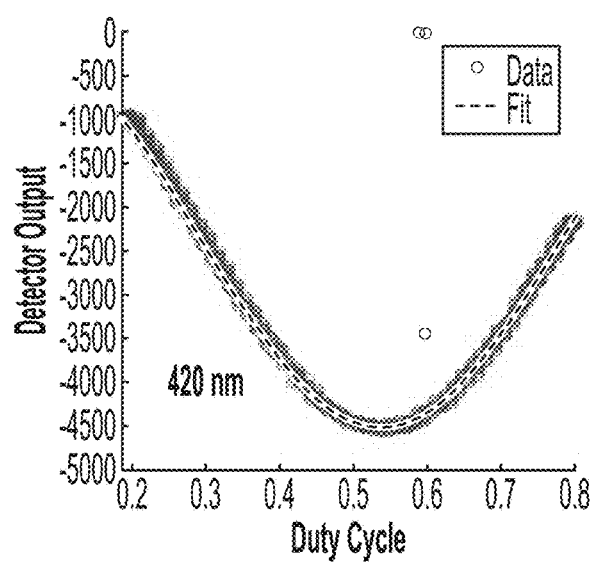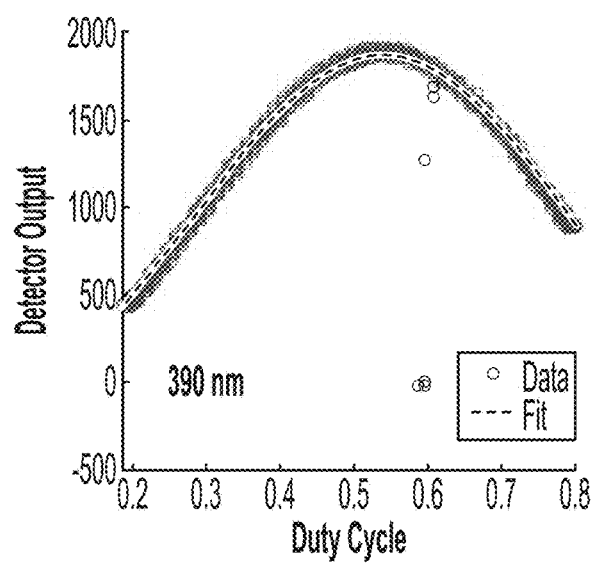
FIG. 21A  FIG. 21B

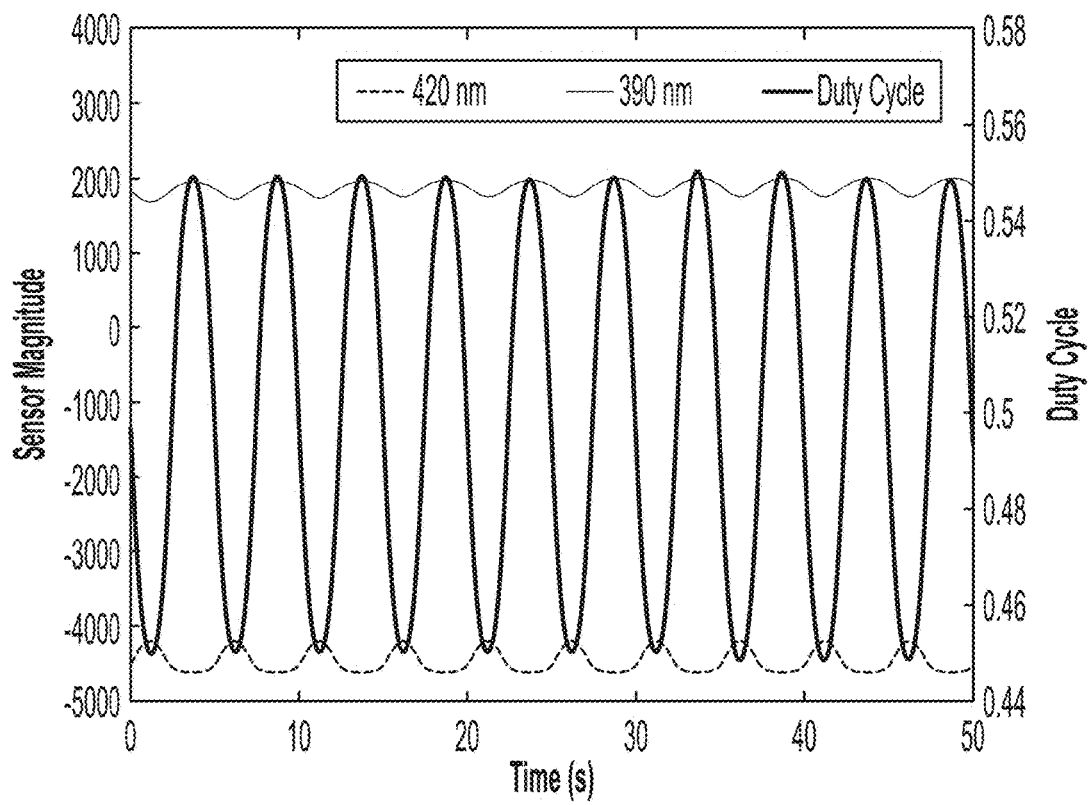
FIG. 22
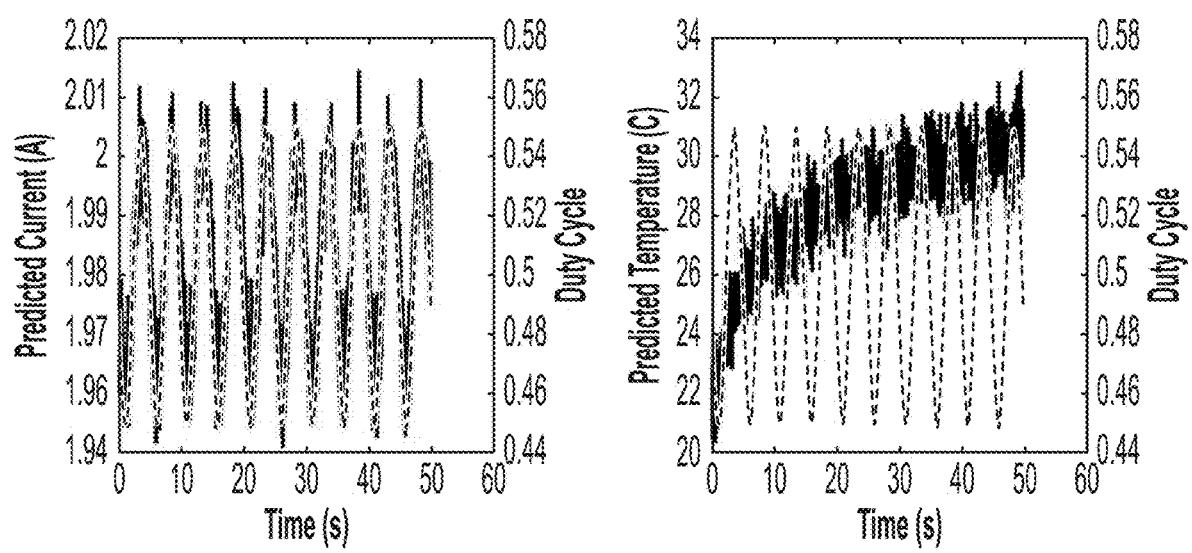
FIG. 23A
FIG. 23B

CONTROL AND PROGNOSIS OF POWER ELECTRONIC DEVICES USING LIGHT

CROSS-REFERENCE OF RELATED APPLICATIONS

This application claims priority to U.S. Provisional Application No. 62/808,242 filed Feb. 20, 2019, the entire contents of which are hereby incorporated by reference.

BACKGROUND OF THE INVENTION

Field of the Invention

The field of currently claimed embodiments of this invention relates to control and prognosis of power electronic devices using light.

Description of Related Art

The interactions of electrons with a semiconductor crystal dissipates energy in forms of heat and light. The development of efficient power devices attempts to minimize the transfer of electron energy into phonons and photons.

On-State Current Techniques

Prior research by Ogawa has demonstrated the use of reflected light to measure current in a motor drive power converter application [5]. This work describes a current sensor consisting of a platinum and magnetic thin film that can be installed in the bus bar of a motor drive. Laser light is reflected off of the film and its polarization determines the current. The difficulty with the Ogawa approach is that the optical probe current sensor requires laser diodes, photodiodes and polarizers. Some embodiments of the current invention can provide a less complex method of current measurement within the switching transistor which will be unique in that the current sensor will not be an additional component as in [5] but may be imbedded in the power converter.

Light Emission Studies

Researchers have investigated the use of light for determining transistor reliability using a variety of methods [6-8]. In [6] (Fabian) a charge coupled device (CCD) camera is used to observe encroaching partial discharge within a power module (not emission from the semiconductor). In [7] Tosi et. al. used Emission Microscopy (EMMI) to measure picosecond resolution of faint luminance waveforms in 0.35 µm gate length Metal Oxide Semiconductor Field Effect Transistors (MOSFETs) operating at 185 MHz. A SPICE model of photo luminescence was used to compare that to analog measurements (No wavelength of emission is mentioned in the paper). In [8] researchers use an ultra-high speed streak camera to measure photo emission (620 nm) from an Insulated Gate Bipolar Transistor (IGBT) following 10 µs of the end of a single gate control pulse (off-state). They recorded location of avalanche emission on the die, but this would not be useful for sensing current during the on-state of the IGBT.

There are ample studies of photon emission in GaN, but the inventors here were unable to find any references using photon emission in GaN power devices for gate control. NPS in collaboration with NRL, has used the hyperspectral imaging probe station at NRL for light emission (400-1000nm) to determine location of possible defects for Transmission Electron Microscope (TEM) studies. NPS has newly developed Deep Level Optical Spectroscopy (DLOS) system that could be used to measure defect energy levels to correlate to Technology Computer Aided Design (TCAD) simulations and optical measurements.

SUMMARY

Accordingly, an optically-monitored and/or optically-controlled electronic device according to an embodiment of the current invention includes at least one of a semiconductor transistor or a semiconductor diode; an optical detector configured to detect light emitted by the at least one of the semiconductor transistor or the semiconductor diode during operation; and a signal processor configured to communicate with the optical detector to receive information regarding the light detected. The signal processor is further configured to provide information concerning at least one of an electrical current flowing in, a temperature of, or a condition of the at least one of the semiconductor transistor or the semiconductor diode during operation.

In some embodiments, the signal processor is further configured to carry out spectral analysis and provide wavelength information. In some embodiments, the condition is device failure prognostics.

In some embodiments, the optical detector includes an optical waveguide optically coupled to the at least one of the semiconductor transistor or the semiconductor diode. In some embodiments, the optical waveguide is an optical fiber. In some embodiments, the at least one of a semiconductor transistor or semiconductor diode is a semiconductor transistor that includes a drain electrode, a source electrode and a gate electrode. In some embodiments, the optically-monitored and/or optically-controlled electronic device further includes a gate controller configured to communicate with the signal processor and the gate electrode so as to provide feedback control of the semiconductor transistor using information based on the light detected by the optical detector.

In some embodiments, the optical detector detects an optical spectrum of light emitted by the at least one of the semiconductor transistor or the semiconductor diode during operation, and the signal processor is further configured to provide information concerning at least one of degradation of or initial condition of the at least one of the semiconductor transistor or the semiconductor diode during operation using the optical spectrum detected.

In some embodiments, the optical detector detects and identifies a wavelength of light emitted by the at least one of the semiconductor transistor or the semiconductor diode during operation. The signal processor is further configured to provide information concerning at least one of degradation of or initial condition of the at least one of the semiconductor transistor or the semiconductor diode during operation using the wavelength detected.

In some embodiments, the optically-monitored and/or optically-controlled electronic device further includes an optical source arranged to inject light into the at least one of the semiconductor transistor or the semiconductor diode, and the optical detector is further configured to detect light at least one of emitted, reflected or scattered from the at least one of the semiconductor transistor or the semiconductor diode during operation.

In some embodiments the at least one of a semiconductor transistor or semiconductor diode is a III-nitride semiconductor device. In some embodiments the at least one of a semiconductor transistor or semiconductor diode is a GaN device. In some embodiments the at least one of a semiconductor transistor or semiconductor diode is one of a field effect transistor, a bipolar junction transistor, or an insulated gate bipolar transistor.

A method of controlling operation of a semiconductor transistor according to an embodiment of the current invention includes applying a voltage between a source electrode and a drain electrode of the semiconductor transistor; applying a gate voltage to a gate electrode of the semiconductor transistor; detecting light emitted by the semiconductor transistor after the applying the voltage and the applying the gate voltage; and modifying the gate voltage based on light detected from the semiconductor transistor.

A method of determining a temperature and current of a semiconductor device according to an embodiment of the current invention includes determining light emitted by the semiconductor device as a function of temperature and current of the semiconductor device over a temperature and current range in a calibration process; applying a voltage to the semiconductor device such that the semiconductor device is in operation and emits light; detecting light emitted by the semiconductor device after the applying the voltage; and determining the temperature and the current of the semiconductor device based on comparing light detected from the semiconductor device and the light determined in the calibration procedure.

In some embodiments the calibration process includes determining the intensity of light emitted by the semiconductor device at a plurality of separate emission peaks for each temperature and current of the semiconductor device over the temperature and current range, and fitting the intensity over the temperature and current range to provide a calibration curve.

In some embodiments the plurality of separate emission peaks is two emission peaks. In some embodiments the calibration process includes band pass filtering the intensity of light emitted to allow the light of the separate emission peaks to pass. In some embodiments the semiconductor device is one of a field effect transistor, a bipolar junction transistor, or an insulated gate bipolar transistor. In some embodiments the semiconductor device is a GaN device.

Some embodiments of the current invention are directed to one or more of the following:

1. The connection of a fiber optic cable or other waveguide to a power semiconductor device in such a way as to record emitted light from the transistor or inject light into the transistor.

2. A system of 1 in which the observed light is used to measure the main path current flow of the transistor. This would be the collector current in an IGBT, the drain current in a MOSFET, or the anode current in a Silicon Controlled Rectifier (SCR) or diode.

3. A system of 2 in which the measured current is utilized for the control of a power converter made from the semiconductor devices of 1.

4. A system of 1 in which the light is used to determine the device temperature and further estimate the junction temperature.

5. A system of 1 in which the emitted light is used to estimate the long-term degradation of the device for prognostics and reliability improvement. In some embodiments, light may be injected into the junction at a convenient time and the reflected light used to measure degradation.

BRIEF DESCRIPTION OF THE DRAWINGS

Further objectives and advantages will become apparent from a consideration of the description, drawings, and examples.

FIG. 2A illustrates a cathodoluminescence image of GaN on Sapphire.

FIG. 2B illustrates a cathodoluminescence image of GaN on bulk GaN. FIGS. 2A and 2B illustrate the decrease in threading dislocation density between the growth methods. Taken from [3].

FIG. 3 illustrates the Internal Quantum Efficiency droop in InGaN quantum well LEDs as a function of current density, for varying values of Auger proportionality coefficients C. Taken from [4].

FIGS. 6A and 6B plot the radiative recombination rate, while FIGS. 6C and 6D plot the Auger recombination rate.

FIG. 7A shows 0 A bias, and external illumination. FIG. 7A is an image of several dies with a probe on one. FIG. 7B shows 0.1 A bias. FIG. 7B shows the luminescence of the die when a small current is injected with the probe. FIG. 7C shows 1 A bias. FIG. 7C shows a higher luminescence when a larger current is injected through the probe.

FIG. 8A illustrates values up to about 1 A, while FIG. 8B illustrates values up to about 3 A.

FIG. 12A shows the current through the GaN diode versus time. FIG. 12B shows the luminous power versus current where the five points are marked.

FIG. 20A illustrates temperature predictions versus time under sinusoidal temperature modulation.

FIG. 20B illustrates current predictions versus time under sinusoidal temperature modulation.

FIG. 21A illustrates variation of 420 nm sensor output versus duty cycle.

FIG. 21B illustrates variation of 370 nm sensor output versus duty cycle.

FIG. 22 illustrates sensor outputs versus time under duty cycle modulation.

FIG. 23A illustrates predicted current versus time under duty cycle modulation.

FIG. 23B illustrates predicted temperature versus time under duty cycle modulation.

DETAILED DESCRIPTION

Figure 1:
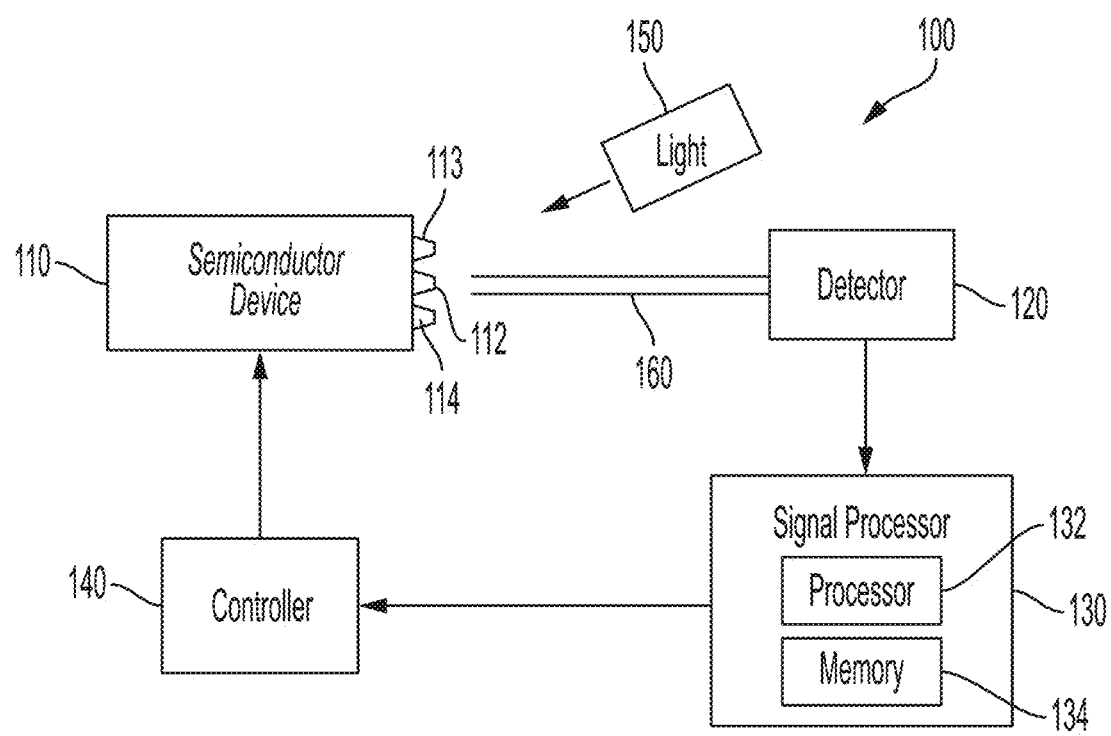
FIG. 1 is a schematic showing a device according to embodiments of the invention.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

The term "light" is intended to have a broad definition that can include light in the visible as well as non-visible regions of the electromagnetic spectrum. For example, the term "light" can include, but is not limited to, visible, infrared, ultraviolet, and terahertz light. Similarly, the term "optical" has a correspondingly broad definition as with the term "light".

Some embodiments of the current invention are directed to power semiconductor transistors or diodes utilizing the light emissions by passive or active means to determine electrical parameters of the energy being transported through the device. This may be by affixing a fiber optic cable or other structure to the transistor/diode die to capture emitted light. The light can then be utilized to measure the device on-state current, temperature, or predict defect generation.

Some embodiments of the current invention are directed to devices and methods that utilize photons emitted in electronic devices that are related to electron transport or crystal degradation. The most common mechanisms in the emission of photons in semiconductor devices are radiative recombination and hot carrier luminescence (HCL).

Some embodiments of the current invention are directed to current and temperature measurement via spectral decomposition of light emission from semiconductor device. For example in some embodiments, there is provided a method of monitoring light emission from wide-bandgap III-N power devices, which in some examples may determine the ON state current in the device needed for power electronic converter control. Measurement of current, in some embodiments, may be accomplished via real-time measurement of the spectral content of light emission from a III-N device under forward steady-state bias. At the same time, the local base die temperature may be simultaneously measured. Fast measurement of the spectral content of light emission may be accomplished in some embodiments by passing the light through optical filters centered around peaks in the spectrum corresponding to light emission due to, for example, exciton recombination in the device. Measurements of the spectral content about these peaks, in some embodiments, may be calibrated versus varying on-state currents and junction temperatures of a representative GaN PN device, as an example. These measurements may then be used to demonstrate extraction of real-time temperature and current variation under test waveforms. Accuracy of current prediction is shown to be within 1%. Methods of improving the temperature predictions and measurement of realistic current waveforms within a converter environment are proposed.

Radiative Recombination—Electron-hole recombination with equivalent momentum can emit photons via band-to-band or trap-assisted recombination (Schottky Read Hall SRH). Radiative emission is most observed where electrons and holes recombine in a forward biased p-n junction, such as a pn diode or Bipolar Junction Transistor (BJT). Light intensity emitted is related to the recombination rate and current density in the junction. Unipolar devices such as FETs and Schottky diodes emit small amounts of radiative recombination emission, unless the absent carrier(s) are injected (only during an on-state) to initiate electron-hole recombination for photon emission.

Hot Carrier Luminescence—Electrons accelerated by electric fields produce spontaneous photon emission when phonon interaction occurs between the hot carrier and lattice. Usually HCL is very weak, and is observed in FETs or drift regions with on-state current. HCL can also be observed in a high e-field device in avalanche mode where light intensity is relative to current density.

Some embodiments of the current invention can use silicon and/or nitride based power devices, such as, but not limited to, the III-Nitride (III-N) material family. The wide bandgaps of GaN (3.4 eV) and AN (6.2 eV) and the reasonably high charge carrier mobilities offer the prospect of power devices with improved performance over devices fabricated from either Si or SiC. Furthermore, the electronic structure of the III-Ns are such that the bandgaps of InN, GaN and AN are direct, leading to emission and absorption of light at the bandgap energy with high quantum efficiency. Indeed, the driving force behind the initial commercialization of the III-Ns was to develop high luminosity blue-green LEDs for lighting applications.

While the electronic properties of the III-Ns are ideal in theory for the construction of efficient power and optical device designs, the development of such devices was initially limited by the material quality of the epitaxial growth of III-Ns atop foreign substrates. High threading dislocation densities of such epitaxial layers limited the maximum feasible contact area of vertical devices, limiting power device design in particular to lateral structures such as HEMTs. Developments in ammono-thermal and hydride vapor-phase epitaxy (HVPE) have resulted in the production of large area, high quality substrates of GaN with dislocation densities below $10^5$ cm$^{-2}$ [1,2]. The scale of this improvement in material quality over traditional GaN-on-Sapphire epitaxy can be seen in FIGS. 2A and 2B.

Such an improvement in bulk GaN substrate growth has enabled the recent fabrication and commercialization of high quality bulk GaN p-i-n diodes with forward current ratings in excess of 10 A and reverse breakdown voltages of greater than 1200V [3]. Improvements in p-type doping of GaN will soon enable the fabrication of high power bipolar transistor device structures such as IGBTs. While such devices are optimized for power efficiency, radiative recombination will dominate the behavior of carrier transport within these devices due to the electronic structure of the material. As in LEDs, the amount of optical power output from these devices will be related to the degree of current injection. Given the relatively high quantum efficiency of these devices, the optical signal emitted by the device can be easily recovered and potentially used to determine the magnitude of the current flowing in the device, even if the device is not optimized for light output.

Radiative Recombination Relationship to Current Density

The optical output of a bipolar semiconductor device is fundamentally related to the magnitude of the current injected into a p-n junction. For a p-n junction diode at high injection, the most common operating point for power devices, the majority of injected charge will recombine within a small distance d of the metallurgical junction. Three major forms of recombination contribute to carrier flow within a p-n junction. Radiative recombination resulting in light emission occurs primarily via direct band recombination of electrons and holes. The rate of radiative recombination is thus proportional to the product of the electron and hole carrier concentrations, n and p:

$$R_{Rad}=B(T)np=Bn^2$$

The radiative proportionality constant B is dependent upon temperature. In high injection, it is a reasonable simplification to assume that local electron and hole concentrations are equal. The photon flux emitted by the device is equal to the rate of radiative recombination. Non-radiative recombination processes occur primarily through Shockley-Read-Hall (SRH) recombination and Auger recombination. SRH recombination of electrons and holes occurs via the trap states of defect centers, and is roughly proportional to the carrier concentration in high injection:

$$R_{SRH}=A(T)n$$

The SRH proportionality constant is a strong function of temperature. Auger recombination occurs via carrier-carrier scattering. Essentially, an electron-hole recombination transition occurs via a collision with a third carrier. The rate of Auger recombination is thus proportional to the cube of carrier concentration. Like radiative and SRH recombination, the Auger proportionality constant is a function of temperature, and also a weak function of carrier concentration:

$$R_{Auger}=C(T,n)n^3$$

The current flowing through the junction can be related to the rate of recombination through the continuity equation:

$$\frac{dn}{dt}=\frac{J}{qd}-R_{junc}=\frac{J}{qd}-An-Bn^2-Cn^3$$

This equation, in conjunction with the assumptions made in deriving the equations for the rates of recombination, is known as the ABC approximation [4]. We assume here that all injected charge into the junction recombines, and that there is no "leakage" of carriers which do not recombine within the device. In steady state, the current can thus be related to local concentration of carrier recombining at the junction:

$$J=qd(A(T)n+B(T)n^2+C(T,n)n^3)$$

For the purposes of measuring current via optical emission, we wish to relate the current to a measurement of photon flux outside of the device. The maximum photon flux that can be measured outside of a radiating junction is given by $$\Phi_{ext}=\eta_{abs}dR_{rad}=\eta_{abs}dB(T)n^2$$

The constant $\eta_{abs}$ represents the reduction in photon flux due to absorption and reflection within the device structure. If the only recombination process present within the device is radiative, then the photon flux will be linearly related to the current. However, the effects of SRH and Auger recombination is to reduce the number of carriers which recombine radiatively. This can be quantified by the external quantum efficiency (EQE), which is the ratio of external photon flux to the flux of carriers, J/q:

$$\gamma_{EQE}=\frac{\Phi_{ext}}{J/q}=\frac{\eta_{abs}B(T)n^2}{A(T)n+B(T)n^2+C(T,n)n^3}$$

The presence of SRH and Auger recombination has two separate effects upon the EQE. Both SRH recombination and Auger recombination make the EQE dependent upon the magnitude of current injection. SRH recombination serves to generally decrease the EQE. Auger recombination plays a large effect under high current injection conditions. At such current densities, the effect of Auger recombination causes the efficiency to peak and then decrease, a condition known as droop. Efficiency droop has been extensively studied in InGaN quantum well LEDs [4]. An example of efficiency droop in an InGaN LED for varying values of the Auger proportionality constant is given in FIG. 3.

The net overall change induced by these effects is that the relationship between photon flux and current changes from a linear relationship to a nonlinear relationship dependent upon the magnitude of the current. The strength of the nonlinearity depends in large part upon the relative magnitudes of the radiative and nonradiative proportionality coefficients. The small values of the radiative recombination coefficient in indirect bandgap materials such as Si and SiC result in highly nonlinear EQE-current relationships with very small magnitudes. Materials such as GaN, however, have much higher radiative recombination coefficients and thus retain a high degree of linearity over larger ranges of current. In addition, temperature dependence is injected into the relationship via temperature dependence of the SRH and Auger proportionality coefficients. Both effects are pertinent for power devices, which operate at high current densities and have significant temperature fluctuations during operation due to self-heating.

FIG. 1 is a schematic illustrating an optically-monitored and/or optically-controlled electronic device 100 according to some embodiments. The electronic device 100 may include a semiconductor device 110, an optical detector 120 and a signal processor 130.

The semiconductor device 110 may be at least one of a semiconductor transistor or a semiconductor diode. The semiconductor device 110 includes semiconductor material. The semiconductor material may include IV-IV, II-VI, or III-V material, for example. The semiconductor material may include a nitride material, for example, such as GaN, for example. The semiconductor material may include a direct band gap material, for example.

The optical detector 120 may be configured to detect light emitted by the at least one of said semiconductor transistor or said semiconductor diode during operation. In this regard, the optical detector 120 may further include collection optics 160 to collect the emitted light from the semiconductor device 110 so that the emitted light may be detected. The collection optics 160 may include an optical waveguide optically coupled to the semiconductor device 110. For example, the optical waveguide may be an optical fiber. The collection optics 160 may further include lenses and mirrors as needed.

The electronic device 100 may optionally include an optical source 150 arranged to inject light into the semiconductor device 110. The optical detector 120 may be configured to detect light at least one of emitted, reflected or scattered from the semiconductor device 110 during operation.

The signal processor 130 may be configured to communicate with the optical detector 120 to receive information regarding the light detected by the optical detector 120. The signal processor 130 may further be configured to provide information concerning at least one of an electrical current flowing in, a temperature of, or a condition of the at least one of the semiconductor transistor or the semiconductor diode during operation.

The signal processor 130 may include a processor 132 and memory 134. The processor 132 may provide functionality for performing calculations based on the information regarding the light detected by the optical detector 120, and based on instructions stored in the memory 134, for example. The signal processor 130 may be configured to carry out spectral analysis and provide wavelength information, for example, based on the information regarding the light detected by the optical detector 120.

The semiconductor device 110 may be a semiconductor transistor comprising a drain electrode 113, a source electrode 114 and a gate electrode 112, for example. The electronic device 100 may optionally include a controller 140, which controls the gate, and is configured to communicate with the signal processor 130 and the gate electrode 112 so as to provide feedback control of the semiconductor transistor using information based on the light detected by the optical detector 120.

A method of controlling operation of a semiconductor transistor according to some embodiments is described. A voltage is applied between a source electrode and a drain electrode of the semiconductor transistor. A gate voltage is applied to a gate electrode of the semiconductor transistor. Light emitted by the semiconductor transistor is detected after the applying the voltage and the applying the gate voltage. The gate voltage is modified based on light detected from the semiconductor transistor.

Figure 4:
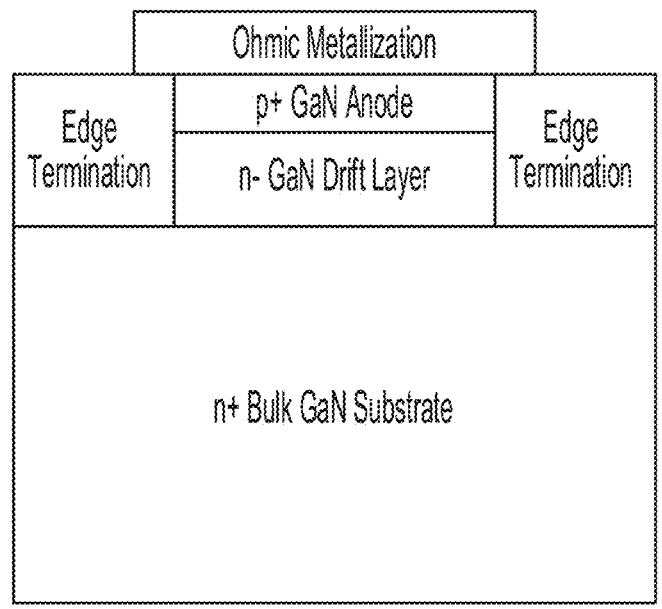
FIG. 4 illustrates a cross sectional cut of a bulk GaN p-n junction structure.

Optical Emission Experimental and Simulation Results in a Vertical III-N Power Device To study the relationship between optical power emission and current in a bipolar power device, a series of simulations and on-wafer measurements were carried out using a vertical p-n junction fabricated on a bulk GaN substrate. Details about the material properties and device fabrication process are given in [3]. A bulk GaN wafer with less than $10^4$ cm$^{-2}$ threading dislocation density was used as the epitaxial substrate. The wafer region was doped n-type to a concentration of $10^{18}$ cm$^{-3}$. An n-type drift region with a thickness of 10 μm was grown via MOCVD. The doping concentration of the drift region was kept below $10^{16}$ cm$^{-3}$. A thin Mg doped p-type with concentration greater than $10^{18}$ cm$^{-3}$ layer formed the anode of the p-n junction. Edge terminations around the ohmic contact to the anode layer increase the breakdown voltage of the device to greater than 1200 V. A diagram depicting the structure of the device is shown in FIG. 4.

Initial studies on the optical power emission output of the GaN p-n junction were carried out via TCAD modeling of the device structure. The Silvaco ATLAS TCAD suite was used to construct a model of the device which reproduced the measured electrical characteristics, specifically the breakdown voltage and forward bias resistance. Thermal modeling was implemented to simulate the effects of self-heating. The radiative recombination coefficient assumed for GaN was $7 \times 10^{-11}$ cm$^3$/s [4]. Carrier lifetimes of 100 ns were assumed for SRH recombination. Auger coefficients of $1 \times 10^{-29}$ cm$^6$/s were used for both electrons and holes based upon work carried out in [9].

Figure 5:
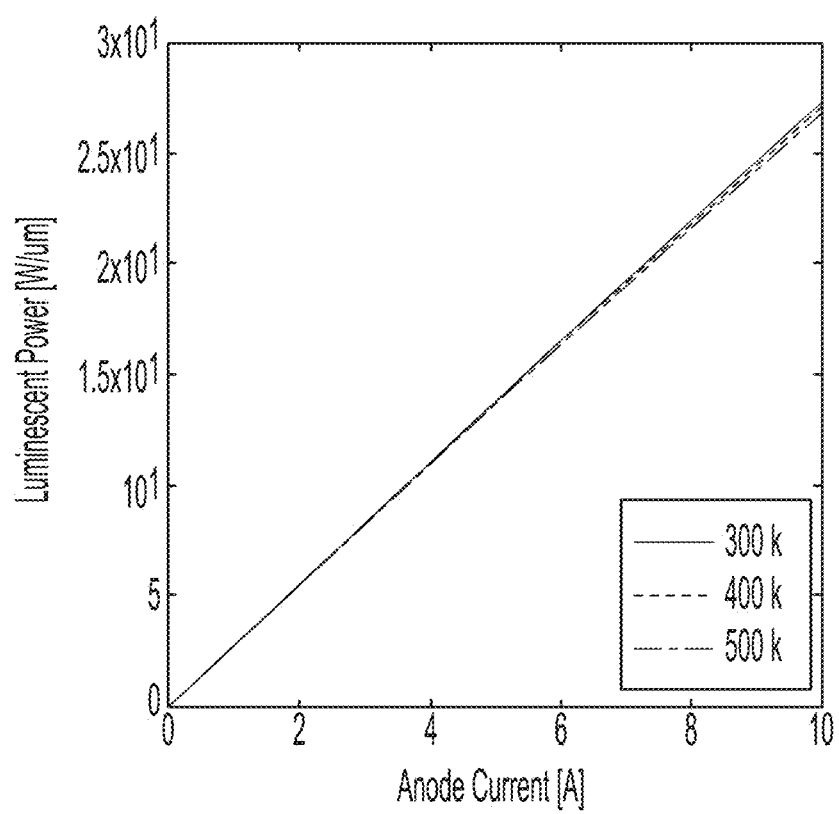
FIG. 5 illustrates a simulated total output luminescent power of the GaN p-n junction versus anode current as a function of substrate temperature.
Figure 6A:
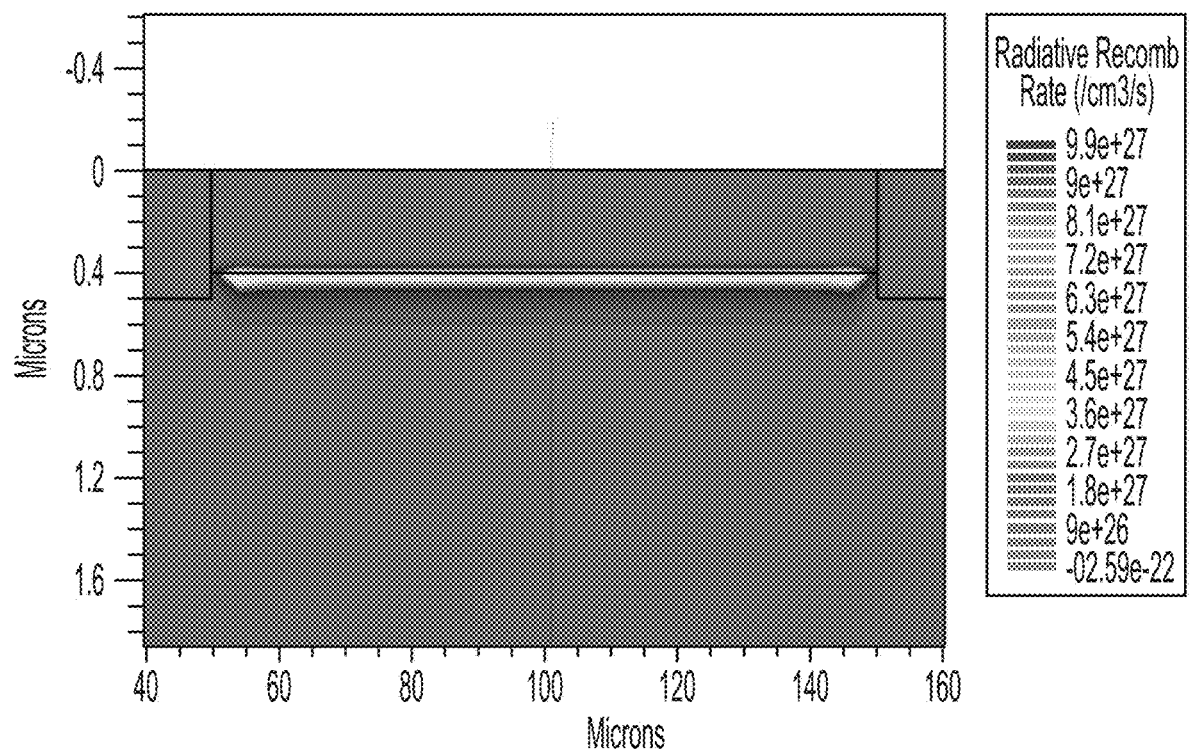
FIGS. 6A-6D illustrate a distribution of recombination rate at 10 A anode current bias with 300 K substrate temperature.
Figure 6B:
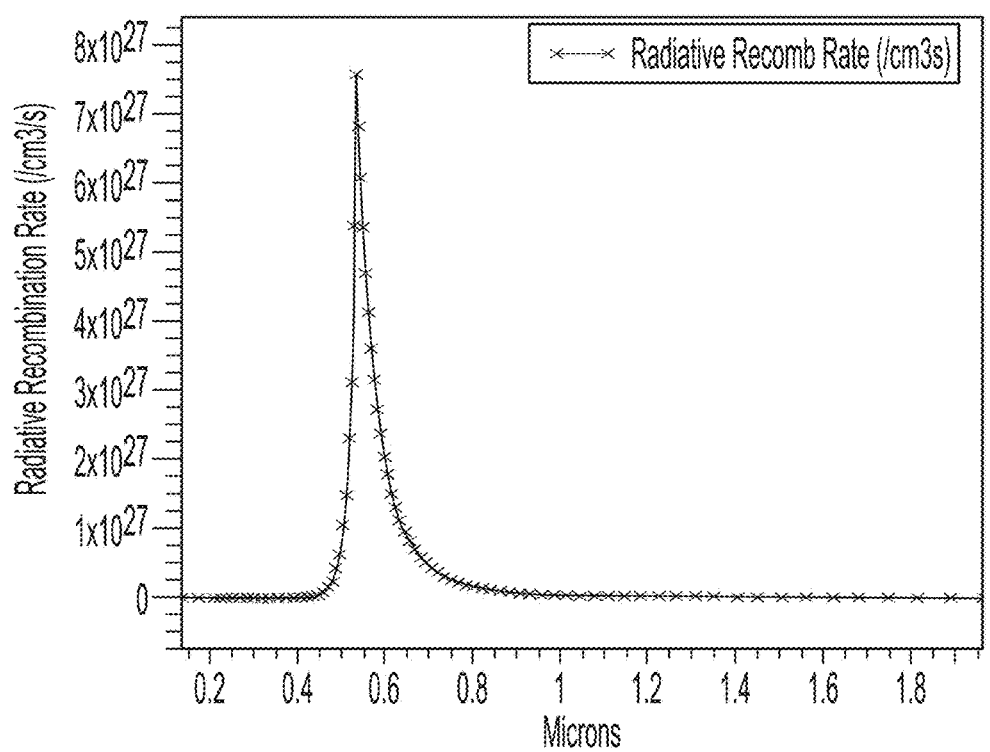
Figure 6C:
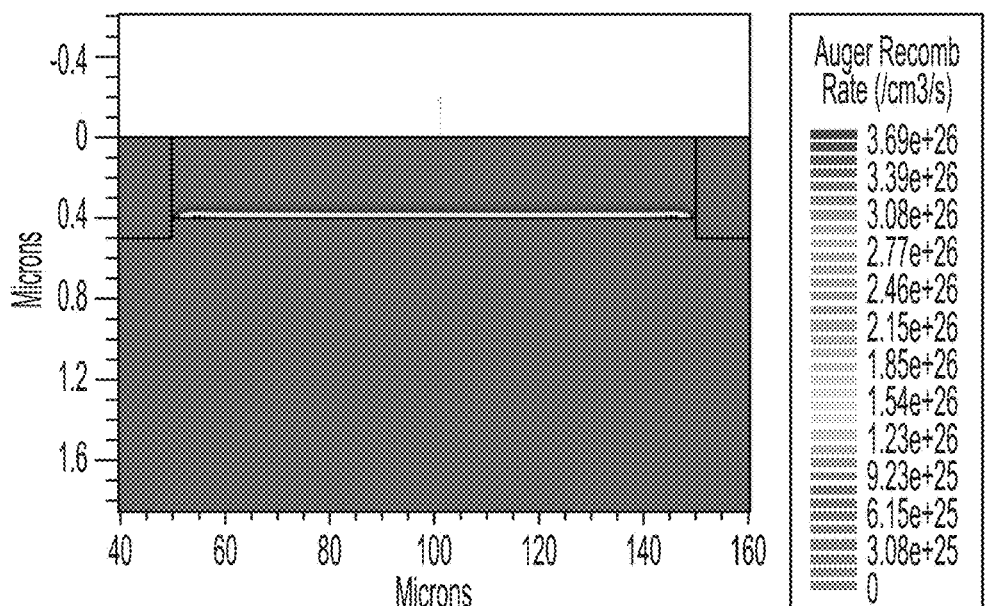
Figure 6D:
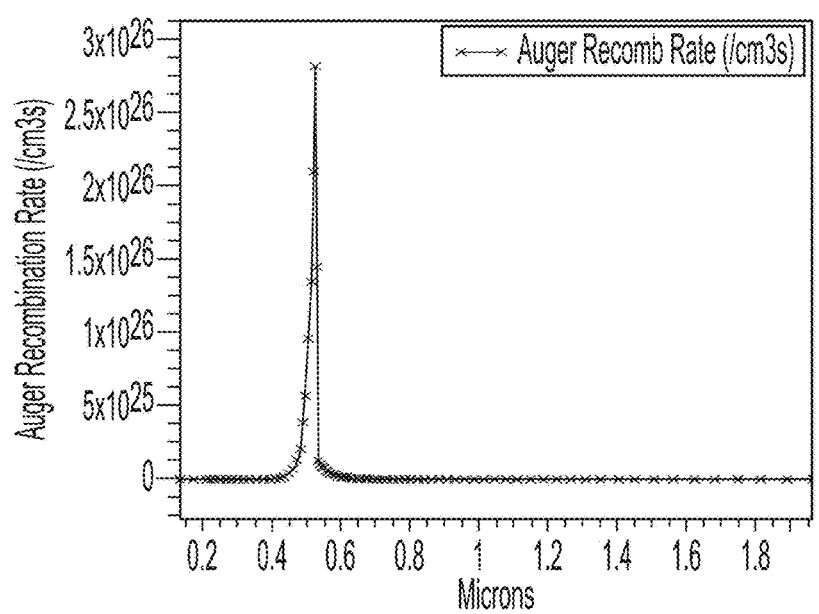

To simulate light output, monochromatic light at the band-edge energy of 3.4 eV was simulated as being emitted where radiative recombination occurred. This is a reasonable approximation to the output spectrum of electroluminescence in GaN. Total luminescent power emitted by the device was recorded as a function of anode current bias. The results of these simulations performed at substrate temperature boundary conditions of 300 K, 400 K and 500 K is presented in FIG. 5.

The simulated optical power-current relationship is found to be highly linear across the range of applied anode currents. The effects of temperature upon light emission are seen most significantly at high anode currents, with decreasing optical power with increasing temperature. This behavior is expected as the rate of SRH and Auger recombination increases with temperature. The distribution of recombination within the device is visualized in FIGS. 6A-6D. Both radiative and Auger recombination are very narrowly distributed about the junction, justifying the ABC approximation based analysis presented in the background.

Figures 7A, 7B, 7C:
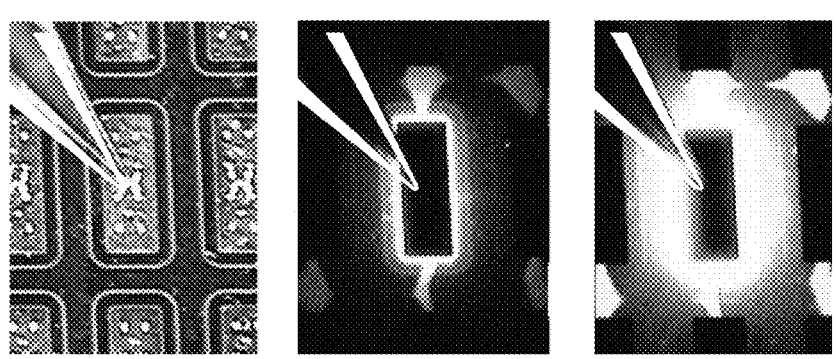
FIGS. 7A-7C are images of the probed GaN p-n junction as a function of anode current bias.

To verify the experimental predictions of the TCAD simulation, a set of measurements was taken on a wafer of GaN p-n junction diodes at NPS. Devices were probed and biased at constant current. Temperature of the wafer was controlled via a temperature controlled chuck at 300 K. The emission of light when the device is biased is clearly seen in FIGS. 7A-7C. FIG. 7A shows 0 A bias, and external illumination. FIG. 7A is an image of several dies with a probe on one. FIG. 7B shows 0.1 A bias. FIG. 7B shows the luminescence of the die when a small current is injected with the probe. FIG. 7C shows 1 A bias. FIG. 7C shows a higher luminescence when a larger current is injected through the probe.

Figure 8A:
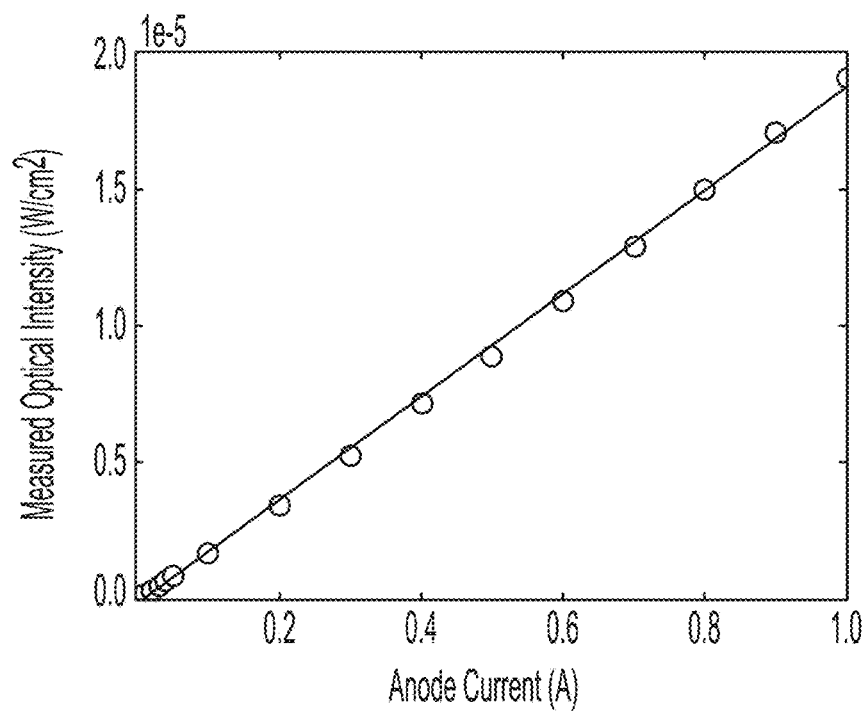
FIGS. 8A and 8B illustrate a measured output optical intensity of the probed GaN p-n junction as a function of anode current. These Figures show the luminescence versus current for the GaN semiconductor. Specifically, the power density is plotted versus current. This is a static curve in that each point is measured over a long amount of time when the current has reached steady-state.
Figure 8B:
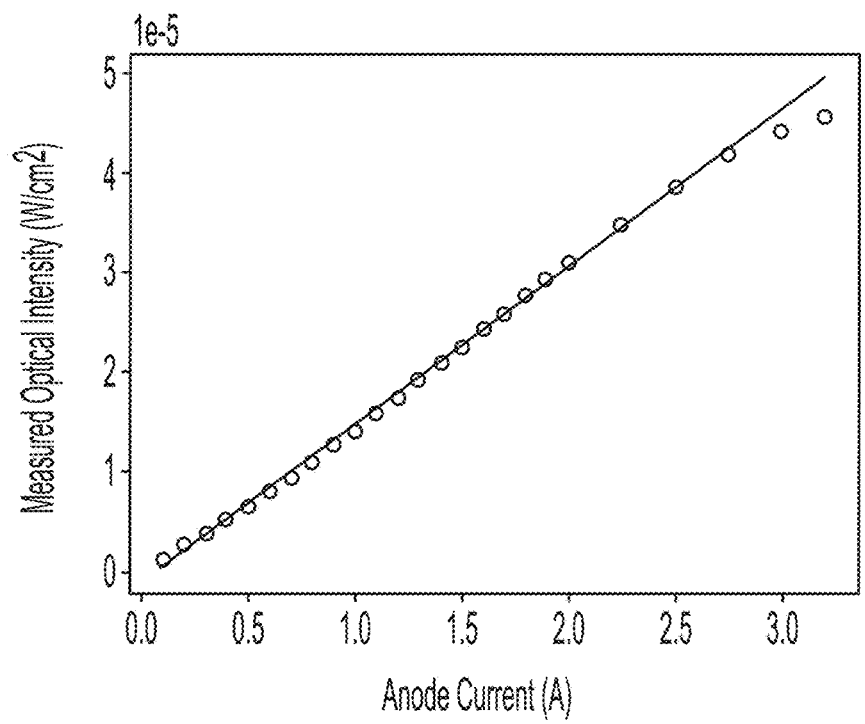

As the device is a power diode not optimized for optical emission, the light captured from the diode is from the junction edge and from light reflected from the wafer back contact. Light is measured via an optical fiber held at a 60° angle 5 cm from the wafer surface. A Newport Optics photodiode is used to measure the optical output power. The measured optical output as a function of current is shown in FIGS. 8A and 8B. The relationship between optical power and anode current is linear for current up to 3 A. However, a deviation from linearity at 2.5 A is seen, corresponding to a drop in EQE. This result is different from the expected behavior predicted by simulation. This difference is hypothesized to be due to higher than expected self-heating due to poor probe-contact pad resistance.

The semiconductor material system of interest could be, for example, silicon-based emission in either an IGBT or PN diode, or GaN-based emission in a Schottky diode.

Demonstrating optical current sensing in an IGBT or silicon PN in a buck converter would be valuable to many power converter applications. Various difficulties with silicon based devices may be using commercial die and etching passivation to improve fiber coupling, or fabricating Si die specifically for fiber coupling. Further, since silicon is an indirect bandgap material, light intensity may not be feasible for a low cost sensor. A possible approach around the low intensity is to sample the on-state emission intensity over many cycles to filter out noise in the measurement.

GaN, a direct bandgap material, is efficient in radiative emission. However a GaN PN junction has a high turn-on voltage (~3V) too high to be useful in a DC converter. A GaN Schottky would be more beneficial for converter circuits, but it has a low rate of electron-hole radiative recombination. An approach around the limited emission in a Schottky, could utilize higher energy photon injection into the Schottky during the beginning of the on-state, and sensing the radiative recombination during the rest of the on-state period.

Current Measurement in a Circuit

Figure 9:
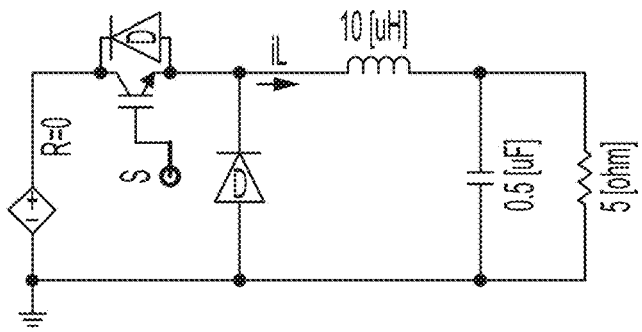
FIG. 9 illustrates a schematic of a standard buck converter.
Figure 10A:
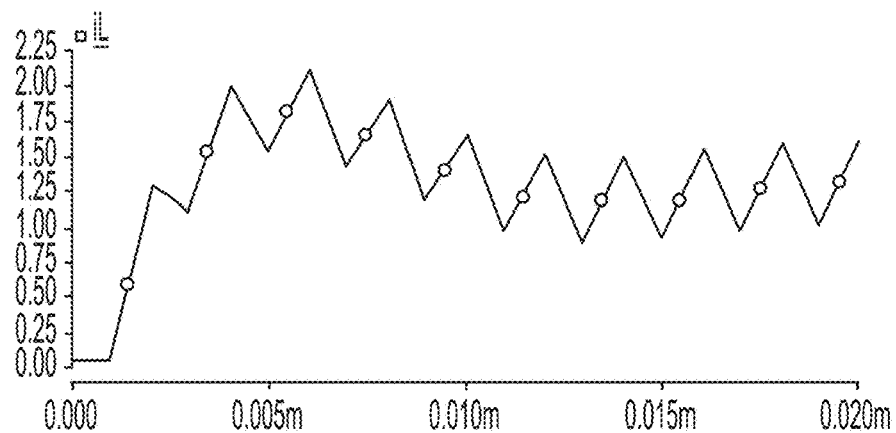
FIG. 10A shows the inductor current for the converter of FIG. 9.
Figure 10B:
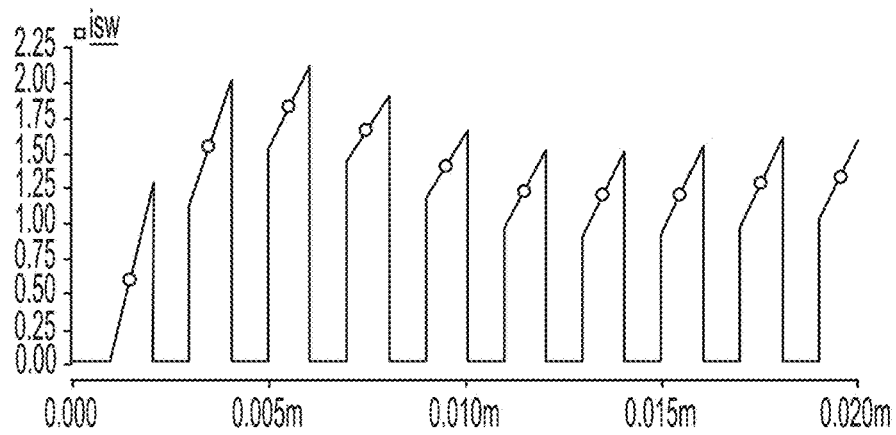
FIG. 10B shows the IGBT current for the converter of FIG. 9.

The need for current measurement is illustrated in the example of FIGS. 9, 10A and 10B which shows a standard buck converter. What is needed for control purposes is a measurement of the current in the inductor on a relatively low-frequency basis such as every few microseconds. From the simulation results below, FIG. 10A shows the inductor current and FIG. 10B shows the IGBT current. What is not of interest is the ripple in the current or noise from the switching and circuit parasitics. If it is possible to determine, through optical means, the IGBT current after it is switched on this would provide a great electrically isolated current measurement for the control. On the IGBT current graphs shown, the desired current samples are indicated by dots.

Device Reliability

If an optical fiber is provided for gate control, the intensity of the optical pulse would be related to the current of the on-state device. It may also be viable to use as a prognostic tool to observe the spectrum of the optical pulse which could provide energy level information on the deep levels of region where recombination occurs.

Figure 11:
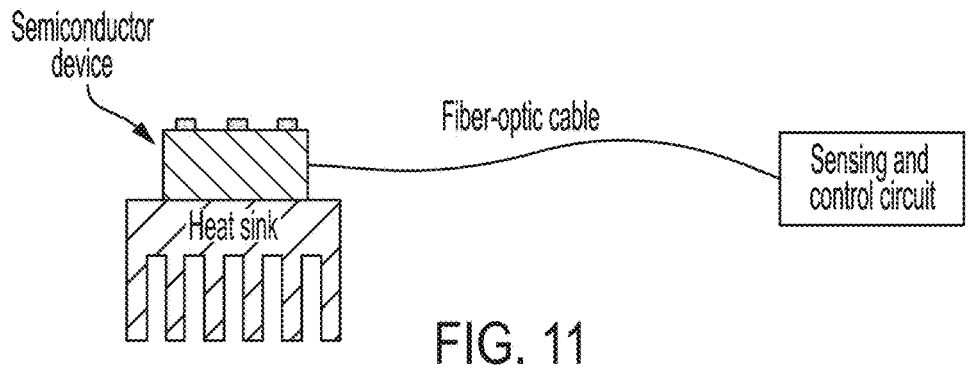
FIG. 11 is a schematic illustration of some concepts of some embodiments of the current invention.

FIG. 11 is a schematic illustration of some concepts of the current invention. On the left is a power semiconductor device mounted to a heat sink which is the heart of many power converters which interface different sources and loads (solar panels, batteries, electric motor drives, etc.). A fiber optic is inserted in the semiconductor package next to the semiconductor die. The cable transmits light between the semiconductor device and the sensing and control circuit (detector, signal processor and controller). This can be used to monitor the device function and determine the current, temperature, or long-term reliability. Light can also be injected into the semiconductor device and reflected back to the sensing circuit for this monitoring.

Figure 12A:
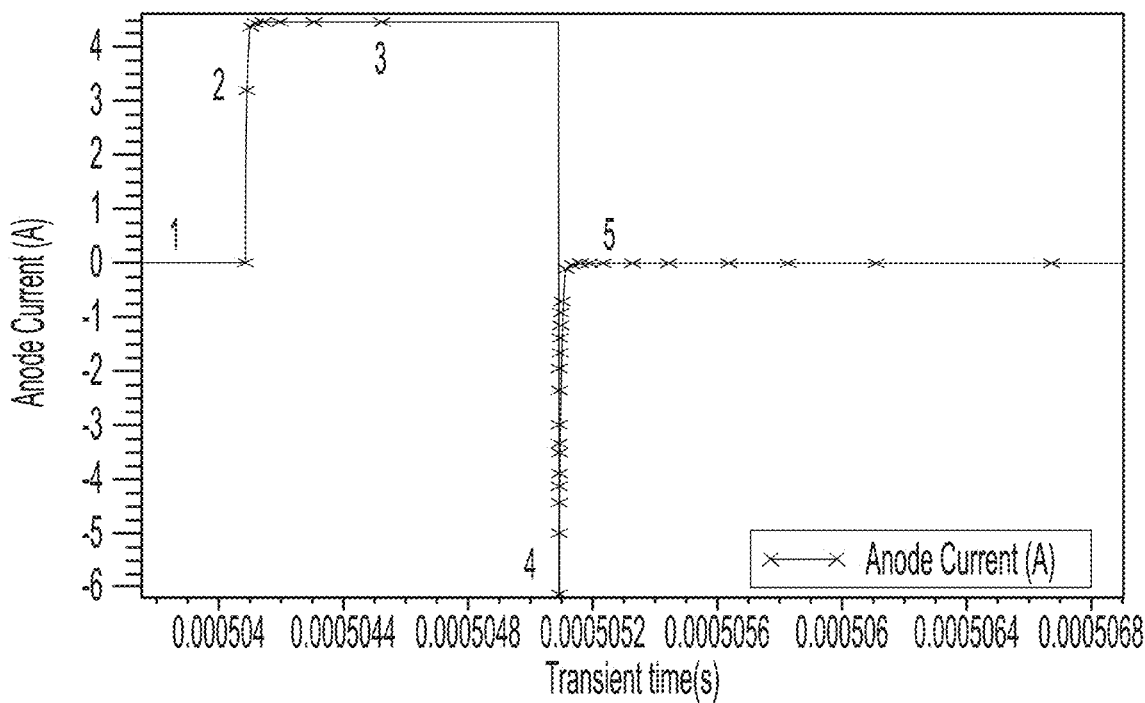
FIGS. 12A and 12B show the light intensity of the GaN diode under dynamic current.
Figure 12B:
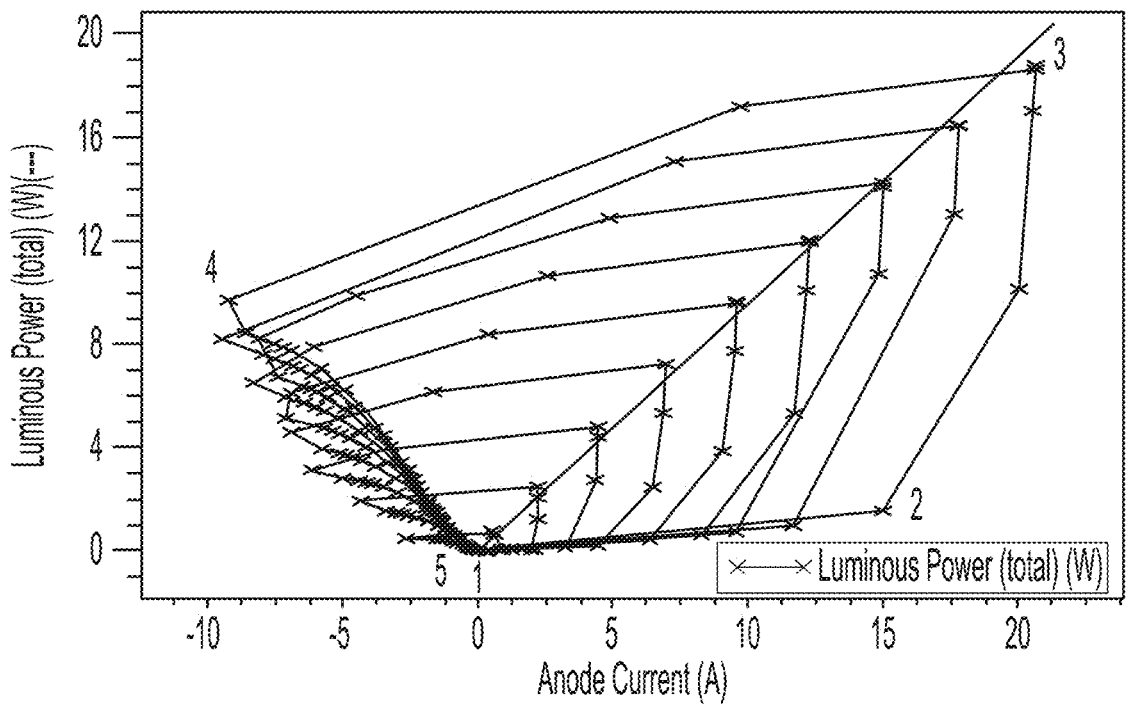

FIGS. 12A and 12B show the light intensity under dynamic current. FIG. 12A shows the current through the GaN diode versus time. Initially, it is at zero (point 1), then the current ramps up as the device goes on (2). The current then it reaches steady-state (3). When the device switches off, it goes through reverse recovery where the current goes negative (4) and finally returns to zero (5). FIG. 12B shows the luminous power versus current where the five points are marked. The same curves can be generated at lower currents producing a family of curves as shown in FIG. 12B. A hysteresis is noted since luminosity is a function of temperature and current. By looking at all of the steady-state operating points, the luminescence can be seen as linearly related to current as indicated by the line added to FIG. 12B.

Current and Temperature Measurement via Spectral Decomposition of Light Emission From Semiconductor Device According to some embodiments, a method of determining a temperature and current of a semiconductor device is described. Light emitted by the semiconductor device is determined as a function of temperature and current of the semiconductor device over a temperature and current range in a calibration process. A voltage is applied to the semiconductor device such that the semiconductor device is in operation and emits light. Light emitted by the semiconductor device is detected after the applying the voltage. The temperature and the current of the semiconductor device is determined based on comparing light detected from the semiconductor device and the light determined in the calibration procedure.

The calibration process may include determining the intensity of light emitted by the semiconductor device at a plurality of separate emission peaks for each temperature and current of the semiconductor device over the temperature and current range, and fitting the intensity over the temperature and current range to provide a calibration surface. The plurality of separate emission peaks may be two emission peaks or more, for example. The calibration process may comprise band pass filtering the intensity of light emitted to allow the light of the separate emission peaks to pass.

A method is described of simultaneously determining temperature and current for a semiconductor device, such as a GaN device. The III-N material family is of paramount importance for RF, optoelectronic and military applications. Recent work on material growth of bulk GaN substrates using Hydride Vapor Phase Epitaxy (HVPE) and ammonothermal methods has opened the possibility of fabrication of large-area vertical GaN power devices capable of surpassing the performance of similar Si and SiC devices [10]. GaN bipolar devices, such as PN junctions and IGBTs, will emit high intensity light under forward bias conditions, even if such devices are not specifically designed for the purpose of light emission. Such light emission does not occur at high intensity in either Si or SiC power devices due to the indirect bandgap of both materials. In contrast, GaN is a direct bandgap semiconductor, and light emission via carrier recombination occurs readily. It is well known that the intensity of light emission from bipolar III-N devices, such as LEDs, is a strong function of the magnitude of driving current and the junction temperature [4].

Independently, the measured total integrated light intensity from a III-N junction cannot be used alone to estimate either current or junction temperature due to self-heating effects. However, the spectrum of photoemission in III-N materials shows wavelength dependent current and temperature variation, which can be utilized to dynamically predict both quantities. According to certain embodiments, methods described herein demonstrate a novel method to directly measure on-state current and junction temperature in real time via spectral decomposition and detection of the light output from a semiconductor device, such as a III-N power device.

Spectral Characteristics of Electroluminescence From GaN Power Devices

The band-edge electroluminescence spectrum of low defect-density, low doped GaN at room temperature has been shown to be dominated by recombination of excitons [11]. This is important to note for GaN power devices as the doping concentration of the drift layer in such devices is typically between $10^{15}$ cm$^{-3}$ and $10^{16}$ cm$^{-3}$. This concentration is below the Mott limit of $3.6 \times 10^{17}$ cm$^{-3}$ in GaN above which exciton formation is screened out by free carriers [12]. The excitonic binding energy of 27.07 meV in GaN is 2.7 times higher than the excitonic binding energy of Si. Excitons will form readily in low doped GaN drift layers even at room temperature and will dominate the luminescence spectrum at wavelengths near the band edge. In addition, the strong coupling of electrons with optical phonons in GaN results in efficient phonon assisted excitonic recombination. This process results in the appearance of several excitonic peaks at wavelengths lower than the band edge by an integer number of optical phonon energies.

The electroluminescence spectrum of a forward biased GaN PN junction will strongly depend upon the magnitude of the excitation current and junction temperature. The general spectral dependence of excitonic electroluminescence is given by $$I_x(\hbar\omega) \propto I^n(\hbar\omega - E_x(T))^\gamma e^{(\hbar\omega - E_x(T))/kT}$$

where $E_x(T)$ is the exciton energy, I the current magnitude and T the local temperature [11]. The peak value of the excitonic spectrum will shift to lower energy with increasing temperature primarily due to the shift in bandgap energy as given by the Varshni equation [11]:

$$E_x(T) = E_x(0) - \frac{\alpha T}{T^2 + \beta}$$

Figure 13A:
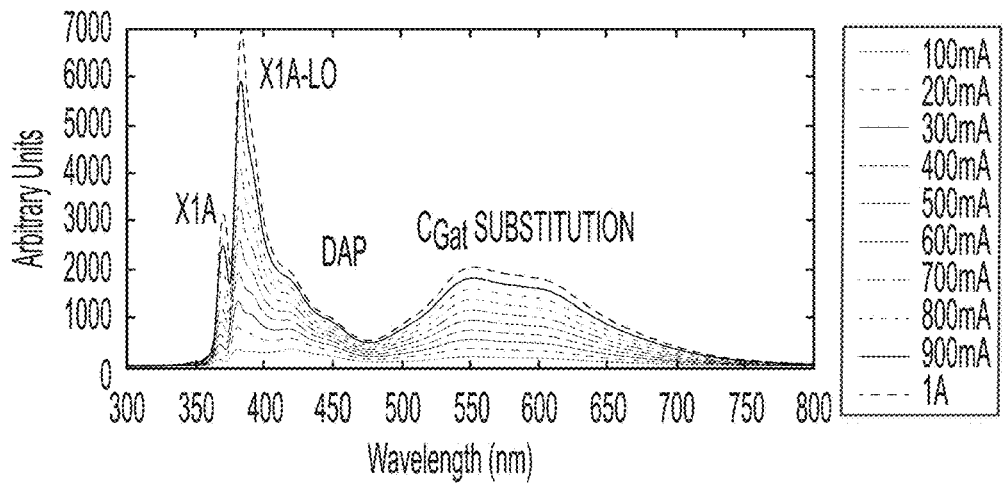
FIG. 13A illustrates the electroluminescence spectra of a GaN PN diode used in this work, where the dependence of the spectra on the forward current magnitude is shown.
Figure 13B:
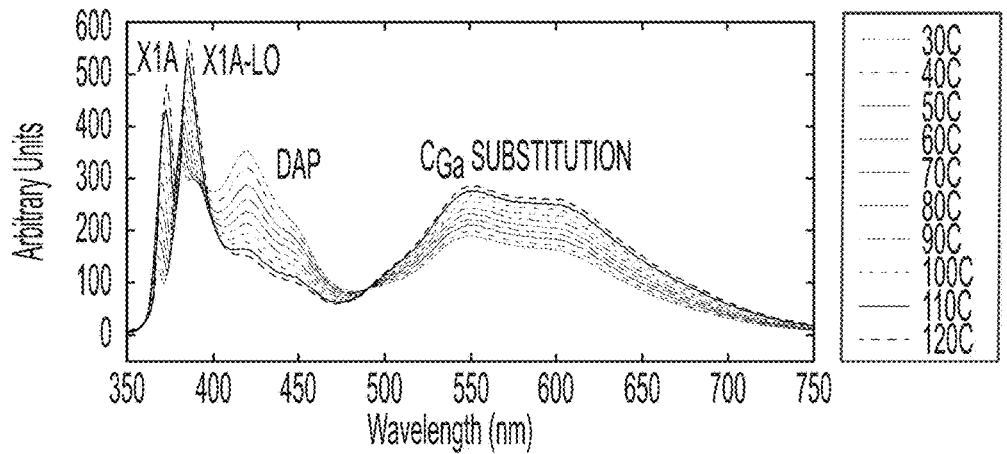
FIG. 13B illustrates the electroluminescence spectra of a GaN PN diode used in this work, where the temperature dependence of the spectrum with the diode biased at 100 mA is shown.

The temperature and current dependence of the electroluminescence spectrum of the GaN vertical PN junction used in this work is shown in FIGS. 13A and 13B. Measurements were taken from devices on-wafer prior to packaging using an Ocean Optics QE65000 spectrometer with a fiber probe. Several distinguishable peaks are observed. Specifically, the X1A and X1A-LO spectral peaks are proposed to be due to emission from direct and phonon-assisted exciton recombination. Similar peaks were observed in photoluminescence experiments in bulk GaN samples of similar doping level [11]. The donor-acceptor-pair (DAP) peak is due to recombination between electrons on donor states and holes occupying the relatively deep Mg acceptor level. The X1A exciton peaks increase with temperature and increase slightly in wavelength with temperature. The DAP spectral peak becomes less prominent as temperature increases and the broad carbon substitution spectral peak increases with temperature increase but does not shift wavelengths.

Current and Temperature Measurement via Spectral Decomposition

Generally, it is difficult to use absolute measurements of external emission intensity to determine directly either the total excitation current or the temperature of the junction. Prior work on laser diodes has demonstrated the possibility of measuring the quasi-Fermi level (QFL) separation within a junction from the electroluminescence spectrum, which can be used to directly estimate the portion of the current contributing to optical recombination [13]. However, even with precise measurements of the QFL separation, the absolute excitation current magnitude cannot be estimated without a knowledge of the internal quantum efficiency of the device. An alternative method of estimating current from device luminescence is by calibrating the measured luminescence magnitude versus measured current. In principle, the total emitted luminescence emitted over the whole luminescence spectrum can be used. Such a method was employed in [14] to determine junction temperature from the photoemission from the body diode of a SiC MOSFET. However, current and temperature cannot be measured simultaneously with an integrated spectrum measurement as the total output intensity is a strong function of both quantities.

According to some embodiments, there is proposed an extension to the calibrated intensity method of measurement. Measurement of both current and associated junction temperature (where the majority of excitonic recombination occurs) of a forward biased bipolar III-N device can be accomplished by measuring the spectral characteristics of the forward biased electroluminescence at high enough resolution to distinguish the current and temperature dependence of the photoemission peaks. However, high resolution spectral measurements necessary to determine the position of these peaks are generally slow, at sampling rates of 1 ms or greater. A practical measurement must be done with a fast sensor. Using a photodetector to measure light filtered about the peak emission wavelengths, measurement speed can be preserved while allowing for information about the spectral dependence upon temperature and current to be explored. Given the emission spectrum $I_T(\omega, I, T)$ applied to a filter with spectral response $F_n(\omega)$ about a frequency $\omega_{filt}$, the dependence of the filter output upon current and temperature will be given by $$f_n(I, T) = \int_0^\infty I_T(\omega, I, T) F_n(\omega) d\omega$$

The filter output is a unique function of the current and temperature. If several filters centered about different peaks of the luminescence spectrum are calibrated prior to measurement versus current and temperature, a set of simultaneous equations is obtained which can be solved for both variables in real time.

The strength of temperature response of the filter output $f_n$ is determined by both the width of the spectral peaks near $\omega_{pk}$ and the full-width half maximum of the filter passband. Wider peaks or filter FWHM values will result in weaker dependence upon temperature due to weaker change in the value of the integral in equation (X). For this reason, the band edge exciton peaks X1A and X1A-LO are preferred for this work, as the position of these peaks have the strongest dependence upon temperature.

Device Under Test

The device used in this study is a bulk GaN PN diode. The device structure consists of a 10 µm compensated n-type epitaxial drift layer grown via MOCVD on a thinned bulk n+ doped GaN substrate, followed by a Mg doped 500 nm p+ layer. The doping concentration of the drift layer was estimated to be $4 \times 10^{15}$ $cm^{-3}$ via CV analysis. Ohmic contacts with contact area of 0.0048 $cm^2$ were formed via e-beam deposition. Edge terminations were formed via ion implantation. Typical electrical characteristics of these diodes are outlined in Table 1.

TABLE 1

Electrical characteristics of the GaN PN diode used in this example.

| | |
|---|---|
| Forward Voltage $V_{on}$ | 3.1 V |
| On Resistance $R_{on}$ | 0.2 Ω |
| Breakdown Voltage $V_{br}$ | 1200 V |

For the testing in this example, the fabricated GaN diodes were diced and packaged in TO-257 open cavity packages. Due to the depth of the TO-257 die cavity and the thin GaN substrate, a 1.2 mm copper interposer was utilized to bond the GaN die to the substrate. This interposer introduced non-negligible thermal and electrical impedance between the die and the package. The implications of this impedance will be discussed below.

Experimental System Design for Measurement

Figure 14:
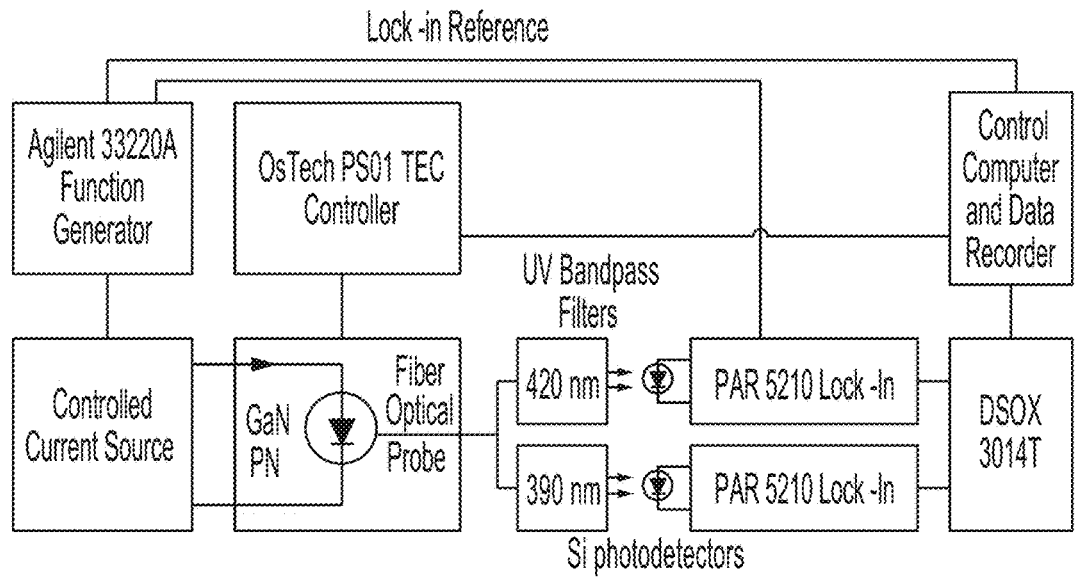
FIG. 14 illustrates a temperature controlled system for light emission measurement under varying current according to some embodiments.

To carry out testing, a system was needed which could precisely control the temperature of a Device Under Test (DUT) while biasing the device with current of arbitrary time dependence. To accomplish temperature control of the DUT, a custom test fixture (see FIG. 14) using thermoelectric coolers (TECs) to control the temperature of a DUT mounted on a cold plate was designed. Two CUI CP85338 TEC coolers were attached to a large heatsink base and connected in series to control the temperature of a 50 mm×50 mm aluminum DUT mounting plate. Temperature was measured via a calibrated thermistor probe. An OsTech PS01 TEC controller was used to provide PID control of the TEC. At no heat load from the DUT, the measured settling time of the cold plate temperature was within 10 s for a temperature step from 20° C. to 100° C. To best estimate DUT temperature, the thermistor probe was placed directly inside of the TO-257 die cavity.

The current source for biasing the DUT was provided by a custom designed feedback control circuit which biased an IGBT in the active mode based upon feedback from a sense resistor. The circuit design used is based upon the work presented in [15]. A calibrated 25 W 1 Ω sense resistor was used as the current feedback sensor to drive an op-amp controlled gate driver to an ST GF3NC120HD IGBT. A reference voltage input controlled the desired current output. To generate various current drive waveforms, an Agilent 33220A function generator was used to control the reference input. The effective risetime of the current step response was measured to be 25 µs.

Optical measurement of photoemission from the DUT was carried out via a fiber coupled probe. A 1-to-7 400 µm solarized fiber bundle was used to couple out light from the DUT to external sensors. The DUT enclosure was placed within an aluminum darkbox to prevent stray light from affecting the measurement. Mounting of the DUT was carried out close to the edge of the coldplate. No focusing of the emitted light was carried out between the DUT and the fiber bundle. Instead, the fiber was placed in the closest possible proximity to the edge of the DUT die in the TO-257 package having the GaN PN, and held in place by an aluminum positioning arm.

To accomplish close placement of the fibers, the TO-257 package was modified to remove the tab sidewall of the package cavity, allowing almost direct contact between the die edge and the fiber. The light output from the fiber bundles was coupled to an enclosed filter module which held an optical filter element and a photodetector element placed in proximity to the filter. Filters used in this experiment ranged from the UV to the mid-visible, with typical peak transmission of 30%. The photodetector element chosen was a UV sensitive Thorlabs FDS010 photodiode (Si photodetector). This detector was chosen both for UV sensitivity in the regions pertinent to photoemission from GaN and a low junction capacitance of 6 pF.

Initial investigations utilized transimpedance amplifiers to measure the signal generated by the photodetector elements. However, as the packaging of the GaN DUT was not optimized for light coupling, it was estimated that >90% of generated optical intensity was lost due to reflection at the GaN-air interface of the die. In addition, losses due to the fiber, filter and a low conversion efficiency of the chosen Si photodetector in the UV range resulted in estimated detector photocurrents of 10 nA and below for relevant DUT bias conditions. This necessitated the use of high transimpedance amplifier gains and thus resulted in typical amplifier bandwidths of less than 1 kHz. To detect small optical signals, a technique known as "chopping" is typically used, in which the optical signal is modulated with a mechanical chopper wheel spinning at a fixed frequency. Similarly, in almost all power electronics applications, drive currents are switched, commuting device current at the switching frequency of the circuit. The light emitted from a GaN power device in a power electronics circuit will therefore be naturally modulated at the switching frequency. The signal-to-noise ratio of the optical signal can be greatly improved by then using a lock-in amplifier to detect the signal. For this reason, our system used two Princeton Applied Research SR5210 lock-in amplifiers to detect the photodetector outputs after filtering. Measurements are taken while the DUT is on-off modulated at fixed frequency by the current drive circuit. The function generator provides a synchronization reference signal to the lock-in amplifier. The lock-in amplifier provides a measure of the first harmonic of the modulated emission waveform, which is proportional to the peak amplitude of the emission. The time-constant of the amplifier controls the signal-to-noise ratio of the output and in turn the response time. In effect, using a lock-in solution amounts to measuring the average signal amplitude over time, rather than the actual point-by-point time dependence. However, as most power electronics controls applications are based upon the average current, which changes at rates lower than the switching frequency, a measurement of the time dependence of the average current should be sufficient. Further implications of the use of a lock-in solution are discussed below. Measurements from the lock-in amplifiers were detected using an Agilent DSOX3014 oscilloscope. Several LabVIEW control programs in a control computer and data recorder were created to control system instruments and output collected data.

Results

Initial calibration was carried out using a LabVIEW control program which stepped current and temperature of the DUT over a programmed range and recorded the output from the lock-in amplifiers at each step. Current was switched in a square wave at a frequency of 1 kHz at a fixed duty cycle of 50%. This switching frequency was chosen based upon the limitations of the 20 µs response of the current drive circuit. Further improvements to the response characteristics of the current drive circuit should make higher switching frequency measurements possible, as the output of the lock-in amplifier response is frequency independent up to the maximum lock-in frequency of 120 kHz. A current range of 0.2 A to 4 A and a temperature range of 20° C. to 110° C. was chosen for the investigations.

Figure 15:
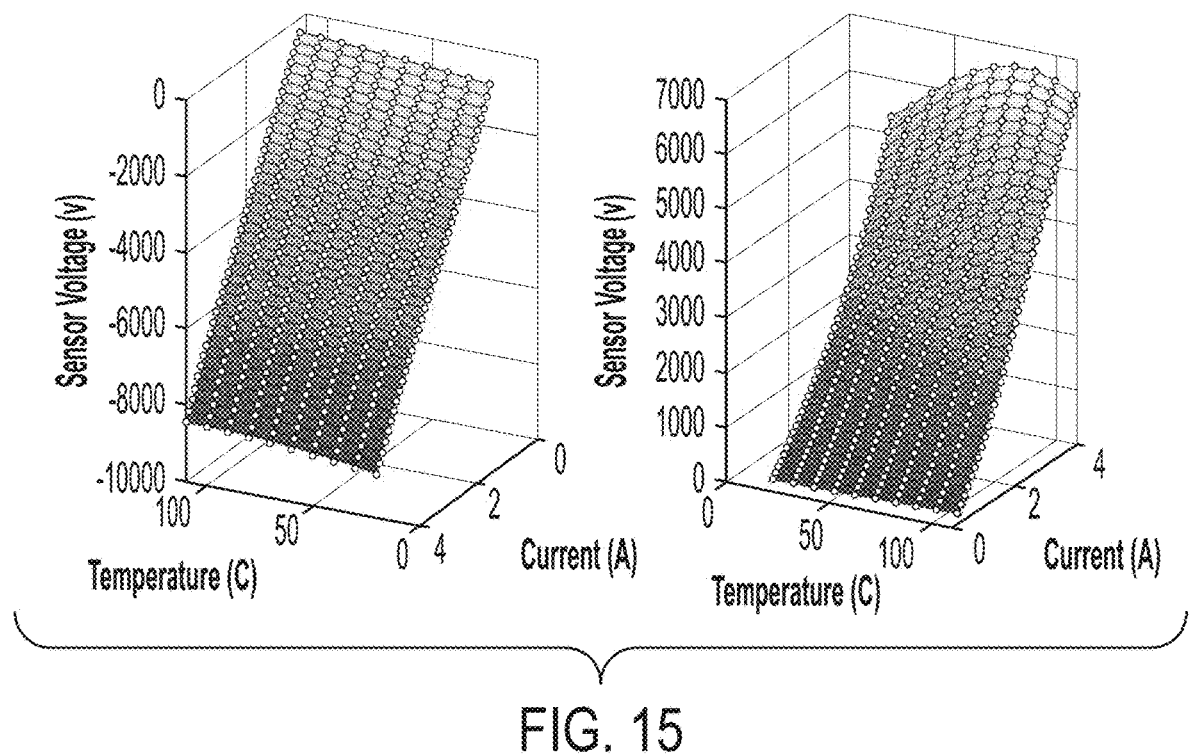
FIG. 15 illustrates calibration data versus temperature and current with fit to a surface, where the left is for a 420 nm emission peak and the right is for a 390 nm emission peak.

Only two wavelengths were monitored simultaneously, and 390 nm and 420 nm filters (see FIG. 14) with 10 nm FWHM were selected for use in the testing due to the signal strengths of these filters and their calibration curves which provided unique intercepts and non-zero calibration values within the range of conducted testing. The 370 nm filter was considered for use as it provided a very large temperature dependence of output at lower temperature ranges counter to the temperature dependence of the 390 nm filter. However, at higher temperatures, this slope began to approach zero values. FIG. 15 shows the in-phase calibration step output magnitudes of both the 420 nm and 390 nm filters.

Using the measured calibration output surface (see FIG. 15), a fit was applied to give a set of equations as a function of temperature and current. A 7th order two variable polynomial in current and temperature was used to fit the data obtained from the 390 nm filter, and a 5th order polynomial was used to fit the data obtained from the 420 nm filter. Due to the oscillatory nature of polynomial fits, the equations obtained cannot be used outside the calibration range. This can be remedied by calibrating over a wider range of currents and voltages, or by applying a physics-based fit which applies over a range outside of the measured values.

Step Response

Figure 16:
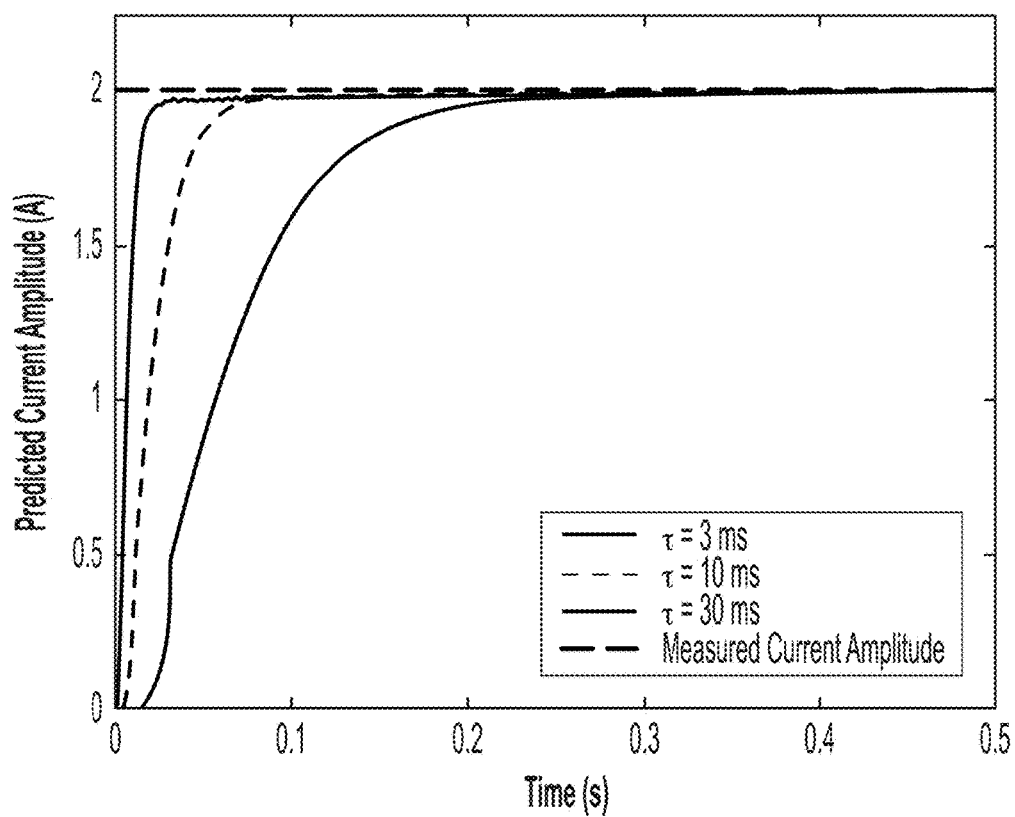
FIG. 16 illustrates a step response of the predicted current at 2 A excitation.

Using the obtained fit data for each filter, the step response of the measurement system was measured. Initial investigations of the step response examined the effect of the lock-in amplifier time constant on the response of the measurement system. A current step of 2 A was applied to the DUT and the temperature was left uncontrolled. A LabVIEW script was used to record the values of the sensors from an attached oscilloscope. A nonlinear solver was then used to recover the estimated current and temperature values. The step response for lock-in time constants varying from 3 ms to 30 ms is shown in FIG. 16. As expected, increasing the lock-in time constant resulted in increasing the settling time for the measurement. The steady-state current estimate is within 0.6% of the measured value of current amplitude.

Figure 17A:
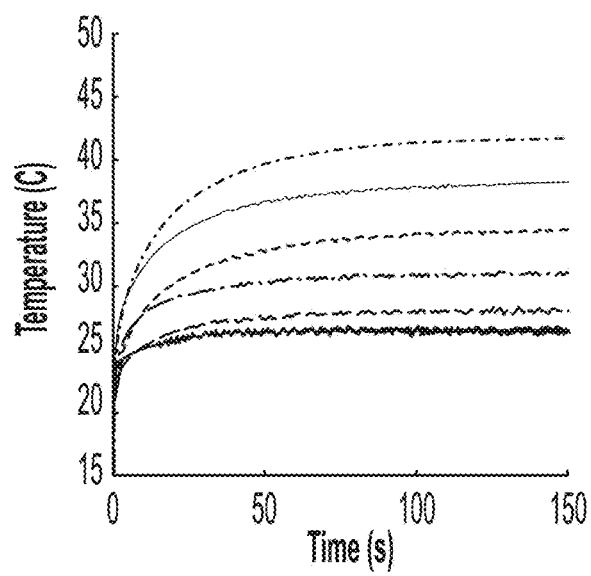
FIG. 17A illustrates a step response of the predicted current at varying current excitation.
Figure 17B:
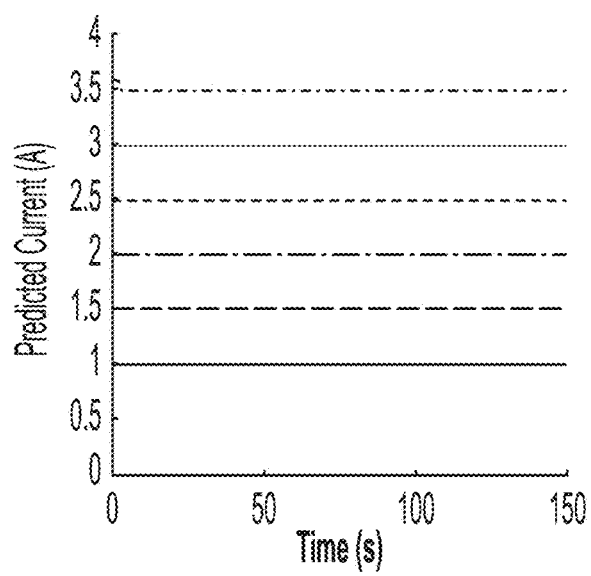
FIG. 17B illustrates a step response of the predicted temperature at varying current excitation.
Figure 17C:
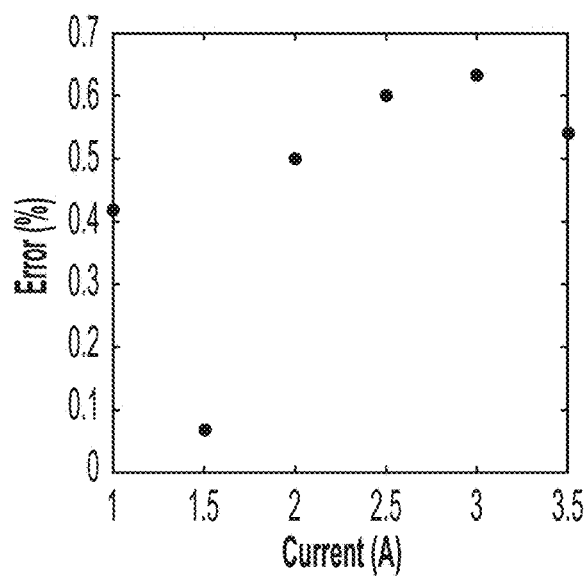
FIG. 17C illustrates the error of predictions for the step response of FIG. 17A.
Figure 17D:
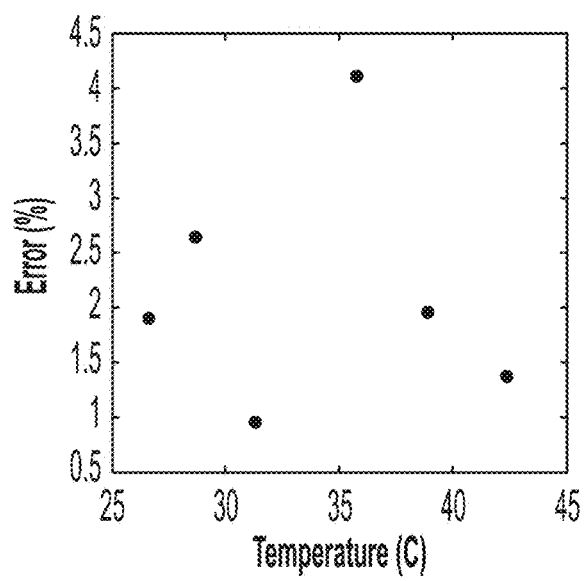
FIG. 17D illustrates the error of predictions for the step response of FIG. 17B.

Further investigations were carried out on the effect of varying current amplitude on the error in estimated current and temperature over a longer time period. Current was stepped and held constant at values between 0.5 A and 3.5 A in 0.5 A steps. Measurements were taken over a 150 s period. Temperature was left uncontrolled by the TEC. The thermistor sensor was used to simultaneously measure temperature over the same period. As shown in FIG. 17A, the estimated current shows excellent agreement with the measured current values. FIGS. 17C and 17D show the error between the estimated and measured current and temperature for each step. A slight increase in error is seen for higher current setpoints. Temperature variation over the same period is shown in FIG. 17B. The time dependence of the temperature variation matches that measured by the local sensor. A constant offset error of around 2.5% error on average was measured over the temperature range.

Stability

Figure 18A:
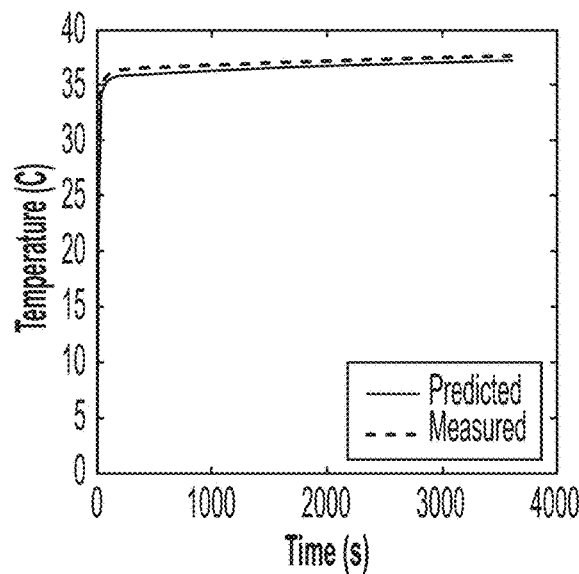
FIG. 18A illustrates a one hour variation of predicted temperature.
Figure 18B:
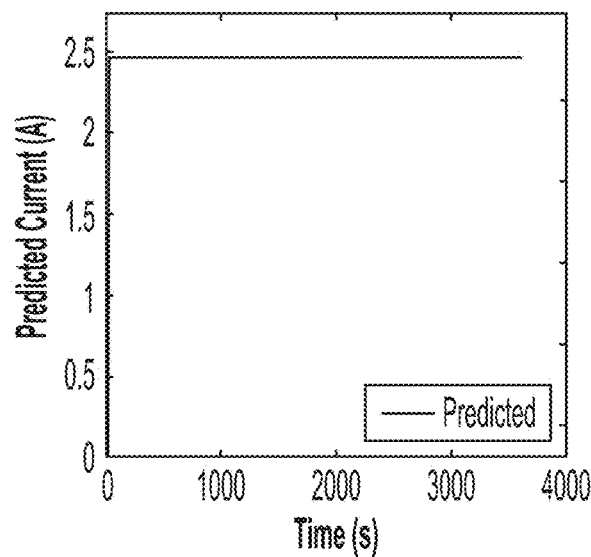
FIG. 18B illustrates a one hour variation of predicted current.

To measure the stability of the system, measurements were taken over a 1-hour period at a fixed current of 2.5 A. Temperature was again left uncontrolled. The predicted current and temperature over this period are shown in FIGS. 18A and 18B. The current was measured periodically using oscilloscope captures (not shown) to be 2.48 A. The error between the measured and predicted current values was measured to be 0.5% over the test. No variation in error between the beginning and end of the test was measurable. Based upon simultaneous measurement of the temperature probe, the predicted temperature followed the actual time variation with good agreement. Again, a steady state error of 2.5% was found between the predicted and estimated temperature.

Time Dependent Modulation

Figure 19A:
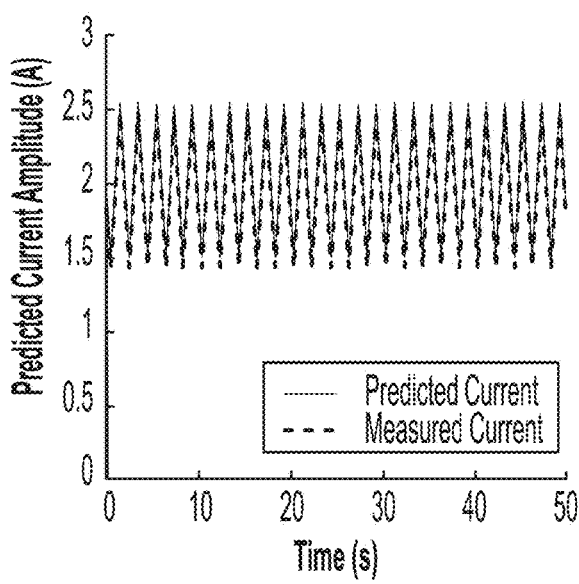
FIG. 19A illustrates triangle wave modulated current prediction versus time.
Figure 19B:
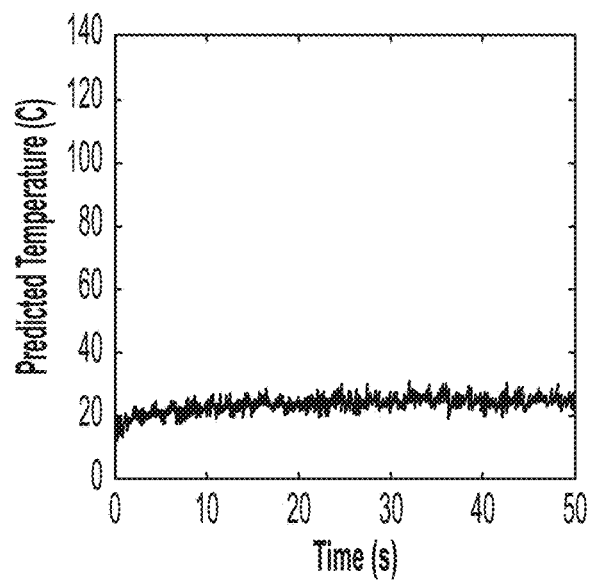
FIG. 19B illustrates temperature prediction versus time.

The tracking ability of the measurement system was investigated by measuring the predicted current and temperature as the temperature and current setpoints were amplitude modulated in time. For current prediction testing, a triangular waveform with peak-to-peak amplitude of 1 A and a repetition frequency of 0.5 Hz was used to modulate a current setpoint of 2 A. The measured versus predicted current amplitude and observed predicted temperature are plotted versus time in FIGS. 19A and 19B. Good agreement between the measured and predicted current was observed during the rise and fall of the triangular waveform. However, larger errors are observed near the turning points of the waveform, which are due to the finite response time of the lock-in amplifier to the quickly changing current at these points.

To test the tracking of the system versus temperature modulation, predicted current and temperature were measured versus time as the temperature setpoint was varied sinusoidally around 40° C. using the TEC controller. The current setpoint was held at 2 A. The sinusoidal variation was applied with an amplitude of 10° C. and a frequency of 0.1 Hz. Modulation at higher frequency was not able to be performed due to the limitation of the response time of the TEC controller. FIGS. 20A and 20B show the variation of the predicted temperature and current versus time with this modulation. Excellent agreement is found between the predicted and measured temperature, again with a constant underestimate by the predicted temperature of 2.5% error. The modulation of the current is seen to "leak" into the predicted current, which is not believed to be physical as no variation in the actual current amplitude was observed via oscilloscope capture. The "leakage" observed is proposed to be due to the finite accuracy of the fit to the calibration data, resulting in uncertainty in assigned current and temperature values by the solver. However, even with the leakage effect, the error induced between the actual current and the predicted current remained within 1% over the modulation period.

Duty Cycle Modulation

The ability of the measurement system to compensate for variable duty cycle was investigated by pulse-width modulating the driving waveform at fixed amplitude. To collect data on the variation of the system output with duty cycle, the duty cycle of the switching waveform was modulated between 0.2 and 0.8 at a frequency of 0.2 Hz. The variation of the in-phase component of the lock-in output (multiplied by 1000) versus duty cycle collected by this test is shown in FIGS. 21A and 21B.

As the lock-in amplifier effectively measures the Fourier coefficient of the first harmonic of the input waveform, variation of sensor output with duty cycle is expected and can be corrected for. For a trapezoidal square wave of amplitude A, period T, finite rise time $\tau_r$, and duty cycle D, the in-phase component of the first harmonic Fourier coefficient is $$\text{Re}\{c_1\} = 2AD\text{sinc}(D)\text{sinc}\left(\frac{\tau_r}{T}\right)\cos\left(D + \frac{\tau_r}{T} + \theta\right)$$

where $\theta$ is the phase shift of the waveform relative to the origin. Fitting this formula to the collected sensor data gives good agreement with the observed variation with duty cycle. Fitting the data with equation above for Re returns a rise time of 10 µs, which is close to the measured rise time of the current waveform. Normalizing the fit to the value at a duty cycle of 0.5 allows for the fit to be used to correct sensor data with duty cycle variation so that the originally obtained calibration data can be used to determine temperature and current.

To test the ability of the system to accurately predict current and temperature as duty cycle varied, a test variation of duty cycle with peak-to-peak amplitude of 0.1 and a frequency of 0.2 Hz was applied. The applied current amplitude was held constant at 2 A and temperature was controlled to be 20° C. The sensor output waveforms are shown in FIG. 22. FIGS. 23A and 23B show the predicted variation of current and temperature versus time. As in the case of modulation by temperature, "leakage" from the duty cycle modulation is observed, which remains within 1% error of the actual applied current amplitude over the test. Similarly, temperature is predicted to vary in time as expected with a constant current amplitude of 2 A applied to the device.

Discussion

The above results demonstrate the feasibility of predicting current and temperature variation from filtered measurements of the output photoemission from semiconductor devices such as a GaN PN power diode during on-state conduction. Testing was carried out using square waves of fixed frequency, and predictions of current and temperature variation were successfully accomplished under modulation of current, temperature and duty cycle.

To carry out temperature prediction of the die, the calibration step may be performed at constant temperature, controlled by the TEC cooler beneath the DUT mounting cold plate. To assure that the temperature controlled is as close to the die temperature as possible, the calibrated thermistor probe was mounted in as close proximity to the die as possible, within the TO-257 package cavity. Even with this placement, it is not expected that the calibrated temperature is the junction temperature of the device itself. This is especially true given the need for a 1.2 mm copper interposer on the backside of the die. Using Silvaco ATLAS, the thermal response time of the die was simulated versus time at the current bias conditions used in this test. It was found that the copper interposer introduced significant thermal impedance between the physical junction and the bottom of the interposer. With the backside of the interposer held at 300 K, steady state temperatures of the junction reached 360 K. Thus, the measured temperature at which the system calibration is performed significantly underestimates the actual junction temperature. At best, it can be used to give an indication of the actual junction temperature, using an estimate of the thermal impedance of the system. A question may also be asked as to whether the time response of the predicted temperature is representative of the temporal response of the junction temperature itself. Based upon the simulation, the time constant of the thermal response of the die-interposer system was found to be 25 ms. As the lowest achievable response time of the lock-in amplifier is 40 ms, it is assumed that the die has equilibrated with the package by the time measurement begins. These effects could be offset in future measurements by utilizing methods which can probe the temperature of the junction directly during the calibration step, by using thermoreflectance or other similar techniques.

As discussed, a method for simultaneously measuring the current and temperature of a semiconductor device is described. In some embodiments, a method is provided for measuring current and temperature through a forward biased GaN PN power diode. Using optical filters centered around photoemission peaks from the diode, signals were detected using lock-in amplifiers and calibrated against a range of currents and temperatures using a novel TEC controlled test system. Calibration data was then used to predict current and temperature under constant current and modulated current, temperature and duty cycle excitation. Predicted currents and temperatures were found to be in good agreement with measured values, with errors in current prediction within 1% in all cases. A discussion of the shortcomings of the method was presented. The ability to predict current and temperature accurately, especially under varying duty cycle conditions, makes the method attractive for utilization in power electronics applications where current control is paramount.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

REFERENCES

[1] R. Kucharski, et. al., "Ammonothermal growth of GaN crystals on HVPE-GaN seeds prepared with the use of ammonothermal substrates", Journal of Crystal Growth, vol. 427, pp. 1-6, 2015.

[2] M. Bockowski, et. al., "Challenges and future perspectives in HVPE-GaN growth on ammonothermal GaN seeds", Semi. Sci. Tech., vol. 31, no. 9, 2016.

[3] I. Kizilyalli, et. al., "Vertical Power p-n Diodes Based on Bulk GaN", IEEE Trans. Elec. Dev., vol. 62, no. 2, pp. 414-422, 2015.

[4] J. Piprek, "Efficiency droop in nitride-based light-emitting diodes", Phys. Stat. Sol. A, vol. 207, no. 10, pp. 2217-2225, 2010.

[5] K. Ogawa, S. Suzuki, M. Sonehara, T. Sato, and K. Asanuma, "Optical Probe Current Sensor Module Using the Kerr Effect and its Application to IGBT Switching Current Measurements," *IEEE International Conference on Sensing Technology*, pages 594-598, Palmerston North, New Zealand, November/December 2011.

[6] J. H. Fabian, S. Hartmann, and A. Hamidi, "Analysis of Insulation Failure Modes in High Power IGBT Modules," *IEEE Industrial Application Society Annual Meeting*, volume 2, pages 799-805, Hong Kong, China, October 2005.

[7] A. Tosi, A. D. Mora, F. Pozzi, and F. Zappa, "Modeling and Probing Hot-Carrier Luminescence from MOSFETs," *IEEE Electron Device Letters*, volume 29, number 4, pages 350-352, April 2008.

[8] T. Matsudai, K. Endo, T. Ogura, T. Matsumoto, K. Uchiyama, F. Niikura, and K. Koshikawa "Direct Photo Emission Monitoring for Analysis of IGBT Destruction Mechanism Using Streak Camera," *IEEE International Symposium on Power Semiconductor Devices*, pages 135-138, Sapporo, Japan, May/June 2017.

[9] E. Kioupakis, et. al., "Temperature and carrier-density dependence of Auger and radiative recombination in nitride optoelectronic devices", New Journal of Physics, vol. 15, pp. 125006, 2013.

[10] Avrutin, D. Silversmith, Y. Mori, F. Kawamura, Y. Kitaoka, and H. Morkoc, "Growth of Bulk GaN and AN: Progress and Challenges," *Proceedings of the IEEE*, vol. 98, no. 7, pp. 1302-1315, 2010.

[11] B. Monemar, P. P. Paskov, J. P. Bergman, A. A. Toropov, T. V. Shubina, T. Malinauskas and A. Usui, "Recombination of Free and Bound Excitons in GaN", Physics Status Solidi B, volume 245, pages 1723-1740, 2008.

[12] K. Oki and Y. Ishitani, "Influence of LO and LA phonon processes on thermal-nonequilibrium excitation and deexcitation dynamics of excitons in GaN, AN and ZnO", J. Appl. Phys., vol. 125, pp. 205705, 2019.

[13] P. Blood, A. I. Kucharska, J. P. Jacobs and K. Griffiths, "Measurement and calculation of spontaneous recombination current and optical gain in GaAs—AlGaAs quantum-well structures", J. Appl. Phys, vol. 70, pp. 1144, 1990.

[14] L. Ceccarelli, H. Luo and F. Iannuzzo, "Investigating SiC MOSFET Body Diode's Light Emission as Temperature-Sensitive Electrical Parameter," Microelectronics Reliability, Pages 627-630, 2018.

[15] M. Krupa and M. Gasior, "A Precise Pulsed Current Source For Absolute Calibration of Current Measurement Systems with No DC Response", Proc. IBIC2016, pp. 165, 2016.

What is claimed is:

1. A method of determining a temperature and current of a semiconductor device, comprising:
  determining light emitted by the semiconductor device as a function of temperature and current of the semiconductor device over a temperature and current range in a calibration process;
  applying a voltage to said semiconductor device such that the semiconductor device is in operation and emits light;
  detecting light emitted by the semiconductor device after the applying said voltage; and
  determining the temperature and the current of the semiconductor device based on comparing light detected from said semiconductor device and the light determined in the calibration procedure,
  wherein the calibration process comprises:
  determining the intensity of light emitted by the semiconductor device at a plurality of separate emission peaks for each temperature and current of the semiconductor device over the temperature and current range, and
  fitting the intensity over the temperature and current range to provide a calibration curve.

2. The method of claim 1, wherein the plurality of separate emission peaks is two emission peaks.

3. The method of claim 1, wherein the calibration process comprises band pass filtering the intensity of light emitted to allow the light of the separate emission peaks to pass.

4. The method of claim 1, wherein the semiconductor device is one of a field effect transistor, a bipolar junction transistor, or an insulated gate bipolar transistor.

5. The method of claim 4, wherein the semiconductor device is a GaN device.

6. The method of claim 4, wherein the semiconductor device is a SiC device.

7. The method of claim 1, wherein said detecting light emitted by the semiconductor device after the applying said voltage is further used to estimate a long-term degradation of the semiconductor device for prognostics and reliability improvement.

8. The method of claim 7, further comprising injecting light into the semiconductor device and measuring reflected light to estimate a degradation of the semiconductor device for prognostics and reliability improvement.

* * * * *